(12) United States Patent
Arai et al.

(10) Patent No.: US 9,658,289 B2
(45) Date of Patent: May 23, 2017

(54) POWER STORAGE MODULE STATE ESTIMATION APPARATUS, BATTERY PACK, AND METHOD FOR ESTIMATING THE STATE OF A POWER STORAGE MODULE

(71) Applicant: Sony Corporation, Tokyo (JP)

(72) Inventors: Narumi Arai, Kanagawa (JP); Manabu Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 137 days.

(21) Appl. No.: 14/628,861

(22) Filed: Feb. 23, 2015

(65) Prior Publication Data
US 2015/0253389 A1    Sep. 10, 2015

(30) Foreign Application Priority Data

Mar. 4, 2014 (JP) ................................ 2014-041394

(51) Int. Cl.
    *G01N 27/416* (2006.01)
    *G01R 31/36* (2006.01)
    *H02J 7/00* (2006.01)

(52) U.S. Cl.
    CPC ....... *G01R 31/361* (2013.01); *G01R 31/3648* (2013.01); *G01R 31/3679* (2013.01); *H02J 2007/005* (2013.01)

(58) Field of Classification Search
    CPC ............ G01R 31/3637; G01R 31/3675; G01R 31/3682
    USPC ............................................ 324/427; 702/63
    See application file for complete search history.

(56) References Cited

U.S. PATENT DOCUMENTS

| 4,677,363 A * | 6/1987 | Kopmann .......... G01R 31/3631 |
| | | 320/131 |
| 6,018,694 A * | 1/2000 | Egami ...................... B60K 6/24 |
| | | 180/65.23 |
| 6,359,419 B1 * | 3/2002 | Verbrugge ............... B60K 6/44 |
| | | 320/132 |
| 7,243,006 B2 * | 7/2007 | Richards ............. G06F 17/5036 |
| | | 318/801 |

(Continued)

FOREIGN PATENT DOCUMENTS

| JP | 2013-158087 | 8/2013 |
| WO | 2013/051241 | 4/2013 |
| WO | 2013/129273 | 9/2013 |

OTHER PUBLICATIONS

Extended European Search Report issued in connection with European Patent Application No. 151562121, dated Jul. 24, 2015. (7 pages).

Primary Examiner — M'Baye Diao
(74) Attorney, Agent, or Firm — K&L Gates LLP

(57) ABSTRACT

According to an example embodiment of the present disclosure, a power storage module state estimation apparatus comprises a parameter calculator configured to calculate a parameter based on a current value of a power storage module, wherein the parameter includes at least one of a direction having a high frequency of current flowing in the power storage module, an average current value of the power storage module, and a charge and discharge capacity after the direction having the high frequency of current flowing in the power storage module is switched; and a hysteresis compensator configured to use the parameter to compensate an open circuit voltage of the power storage module.

18 Claims, 24 Drawing Sheets

(56) References Cited

U.S. PATENT DOCUMENTS

| | | | |
|---|---|---|---|
| 8,395,355 B2* | 3/2013 | Kaita | B60L 11/123 |
| | | | 180/65.31 |
| 8,704,496 B2* | 4/2014 | Kimura | B60L 11/1838 |
| | | | 320/162 |
| 2006/0091863 A1* | 5/2006 | Melichar | G01R 31/361 |
| | | | 320/132 |
| 2010/0121587 A1* | 5/2010 | Vian | G01R 31/3651 |
| | | | 702/63 |
| 2010/0131217 A1* | 5/2010 | Ichikawa | G01R 31/361 |
| | | | 702/63 |
| 2012/0274331 A1* | 11/2012 | Liu | G01R 31/362 |
| | | | 324/426 |
| 2013/0124121 A1* | 5/2013 | Hariharasudhan | G01R 31/3624 |
| | | | 702/63 |
| 2014/0257726 A1 | 9/2014 | Baba et al. | |
| 2014/0343877 A1* | 11/2014 | Kimura | G01R 31/3648 |
| | | | 702/63 |
| 2015/0219727 A1* | 8/2015 | Ziemian | G01R 31/3606 |
| | | | 702/63 |
| 2015/0234013 A1* | 8/2015 | Migita | G01R 31/3606 |
| | | | 702/63 |
| 2016/0216336 A1* | 7/2016 | Ishii | H02J 7/0021 |

\* cited by examiner

FIG. 8A

| | $\Delta Q$ | \multicolumn{4}{c}{$T = T_1$} |
|---|---|---|---|---|---|
| $I$ | | 100 mAh | 200 mAh | $\cdots$ | 1000 mAh |
| −0.1 A | | $\Delta V_{111}$ | $\Delta V_{121}$ | $\cdots$ | $\Delta V_{1101}$ |
| −0.2 A | | $\Delta V_{211}$ | $\Delta V_{221}$ | $\cdots$ | $\Delta V_{2101}$ |
| $\vdots$ | | $\vdots$ | $\vdots$ | $\vdots$ | $\vdots$ |
| −1.0 A | | $\Delta V_{1011}$ | $\Delta V_{1021}$ | $\cdots$ | $\Delta V_{10101}$ |

FIG. 8B

| | $\Delta Q$ | \multicolumn{4}{c}{$T = T_1$} |
|---|---|---|---|---|---|
| $I$ | | 100 mAh | 200 mAh | $\cdots$ | 1000 mAh |
| 0.1 A | | $\Delta V_{111}$ | $\Delta V_{121}$ | $\cdots$ | $\Delta V_{1101}$ |
| 0.2 A | | $\Delta V_{211}$ | $\Delta V_{221}$ | $\cdots$ | $\Delta V_{2101}$ |
| $\vdots$ | | $\vdots$ | $\vdots$ | $\vdots$ | $\vdots$ |
| 1.0 A | | $\Delta V_{1011}$ | $\Delta V_{1021}$ | $\cdots$ | $\Delta V_{10101}$ |

POWER STORAGE MODULE STATE ESTIMATION APPARATUS, BATTERY PACK, AND METHOD FOR ESTIMATING THE STATE OF A POWER STORAGE MODULE

CROSS REFERENCES TO RELATED APPLICATIONS

The present application claims priority to Japanese Priority Patent Application JP 2014-041394 filed in the Japan Patent Office on Mar. 4, 2014, the entire content of which is hereby incorporated by reference.

BACKGROUND

The present disclosure relates to a power storage member state estimation device, a battery pack, an electric vehicle, a power storage device, and a power storage member state estimation method. In more detail, the present disclosure relates to a power storage member state estimation device that estimates the state of a power storage member, a battery pack, an electric vehicle, a power storage device, and a power storage member state estimation method.

In the related art, a technology that estimates the state of a power storage member based on the open circuit voltage (OCV) of the power storage member has been proposed. For example, a power storage system that calculates a charging state (SOC) according to an inter-terminal voltage, that is, the OCV, of a power storage device detected with a voltage sensor based on relational data of the inter-terminal voltage and the SOC created in advance is proposed in Japanese Unexamined Patent Application Publication No. 2013-158087. In such a power storage system, the SOC is calculated selectively using two relational data items according to the magnitude relationship between the integrated value of the discharge current value and the integrated value of the charge current value as the relational data.

SUMMARY

It is desirable to precisely estimate the open circuit voltage taking the charge and discharge history in consideration.

The present disclosure provides a power storage member state estimation device that estimates an open circuit voltage with high precision, a battery pack, an electric vehicle, a power storage device, and a power storage member state estimation method.

According to an example embodiment of the present disclosure, a power storage module state estimation apparatus comprises a parameter calculator configured to calculate a parameter based on a current value of a power storage module, wherein the parameter includes at least one of a direction having a high frequency of current flowing in the power storage module, an average current value of the power storage module, and a charge and discharge capacity after the direction having the high frequency of current flowing in the power storage module is switched; and a hysteresis compensator configured to use the parameter to compensate an open circuit voltage of the power storage module.

According to an example embodiment of the present disclosure, a battery pack comprises a power storage module; a parameter calculator configured to calculate a parameter based on a current value of the power storage module, wherein the parameter includes at least one of a direction having a high frequency of current flowing in the power storage module, an average current value of the power storage module, and a charge and discharge capacity after the direction of a dominant current flow is switched; and a hysteresis compensator configured to use the parameter to compensate an open circuit voltage of the power storage module.

According to an example embodiment of the present disclosure, a method for estimating the state of a power storage module comprises calculating a parameter based on a current value of a power storage module, wherein the parameter includes at least one of a direction having a high frequency of current flowing in the power storage module, an average current value of the power storage module, and a charge and discharge capacity after the direction having the high frequency of current flowing in the power storage module is switched; and compensating an open circuit voltage of the power storage module based the parameter.

According to an embodiment of the present disclosure, there is provided a power storage member state estimation device including a parameter calculator that calculates a parameter based on an obtained current value of a power storage member; a first open circuit voltage calculator that calculates an open circuit voltage of the power storage member; a hysteresis compensator that performs hysteresis compensation that reduces errors due to hysteresis of the open circuit voltage calculated by the first open circuit voltage calculator based on the parameter calculated by the parameter calculator.

In the power storage member state estimation device, the parameter may include at least one of a direction having a high frequency of current flowing in a direction of current of the power storage member, an average current value of the power storage member, and a charge and discharge capacity after the direction having a high frequency of current flowing is switched.

In the power storage member state estimation device, the hysteresis compensator may include a hysteresis compensation amount calculator that calculates a compensation amount of the open circuit voltage corresponding to the parameter, and a second open circuit voltage calculator that calculates the open circuit voltage after the hysteresis compensation based on the compensation amount calculated by the hysteresis compensation amount calculator.

In this case, the hysteresis compensation amount calculator may calculate the compensation amount further corresponding to at least one of a current value, a temperature, and a charging state estimation value of the power storage member.

The power storage member state estimation device may further include an open circuit voltage validity determination device that determines whether the open circuit voltage calculated by the first open circuit voltage calculator is valid as a target of the hysteresis compensation based on at least one of the parameter, the current value, the temperature, and the charging state estimation value of the power storage member, wherein the hysteresis compensator performs the hysteresis compensation with respect to open circuit voltage determined to be valid by the open circuit voltage validity determination device.

The power storage member state estimation device may further include a charging state calculator that calculates a charging state value of the power storage member based on the open circuit voltage after the hysteresis compensation.

In this case, the power storage member state estimation device may further include an open circuit voltage curve calculator that calculates an open circuit voltage curve of the power storage member based on the charging state value calculated by the charging state calculator.

In this case, the parameter may include the direction having a high frequency of current flowing in the direction of current of the power storage member, and the open circuit voltage curve calculator includes a storage device that stores the open circuit voltage after hysteresis compensation, the direction having a high frequency of current flowing calculated by the parameter calculator, and the charging state value calculated by the charging state calculator, and an open circuit voltage curve generator that generates two open circuit voltage curves according to a difference in the direction having a high frequency of current flowing based on information recorded in the storage device.

The power storage member state estimation device may further include a deterioration state calculator that calculates a deterioration state value of the power storage member based on the open circuit voltage curve calculated by the open circuit voltage curve calculator.

The power storage member state estimation device may perform calculation of a state value of the power storage member based on the hysteresis compensation based on the measurement results of the state of the power storage member that includes at least a current value acquired by communication and the open circuit voltage after hysteresis compensation.

According to another embodiment of the present disclosure, there is provided a battery pack including a secondary battery; and a power storage member state estimation device that includes a parameter calculator that calculates a parameter based on an obtained current value of the secondary battery, a first open circuit voltage calculator that calculates an open circuit voltage of the secondary battery, and a hysteresis compensator that performs hysteresis compensation that reduces errors due to hysteresis of the open circuit voltage calculated by the first open circuit voltage calculator based on the parameter calculated by the parameter calculator.

According to still another embodiment of the present disclosure, there is provided an electric vehicle, including a power storage member; a power storage member state estimation device; and a conversion device that converts a supply of power from the power storage member to driving power for a vehicle; wherein the power storage member state estimation device includes a parameter calculator that calculates a parameter based on an obtained current value of the power storage member, a first open circuit voltage calculator that calculates an open circuit voltage of the power storage member, and a hysteresis compensator that performs hysteresis compensation that reduces errors due to hysteresis of the open circuit voltage calculated by the first open circuit voltage calculator based on the parameter calculated by the parameter calculator.

According to still another embodiment of the present disclosure, there is provided a power storage device, including a power storage member; and a power storage member state estimation device that includes a parameter calculator that calculates a parameter based on an obtained current value of the power storage member, a first open circuit voltage calculator that calculates an open circuit voltage of the power storage member, and a hysteresis compensator that performs hysteresis compensation that reduces errors due to hysteresis of the open circuit voltage calculated by the first open circuit voltage calculator based on the parameter calculated by the parameter calculator.

According to still another embodiment of the present disclosure, there is provided a power storage member state estimation method, including performing hysteresis compensation that reduces errors due to hysteresis of the open circuit voltage based on a parameter calculated based on an acquired current value of the power storage member with respect to an acquired open circuit voltage of the power storage member.

According to the disclosure, it is possible to estimate the open circuit voltage with high precision.

Additional features and advantages are described herein, and will be apparent from the following Detailed Description and the figures.

BRIEF DESCRIPTION OF THE FIGURES

FIGS. 8A and 8B are schematic diagrams showing tables in which the compensation amount of the hysteresis compensation associated with the average current, $\Delta Q$, and the temperature is recorded as a configuration example of the power storage member state estimation device of the second embodiment of the disclosure;

DETAILED DESCRIPTION

Figure 1:
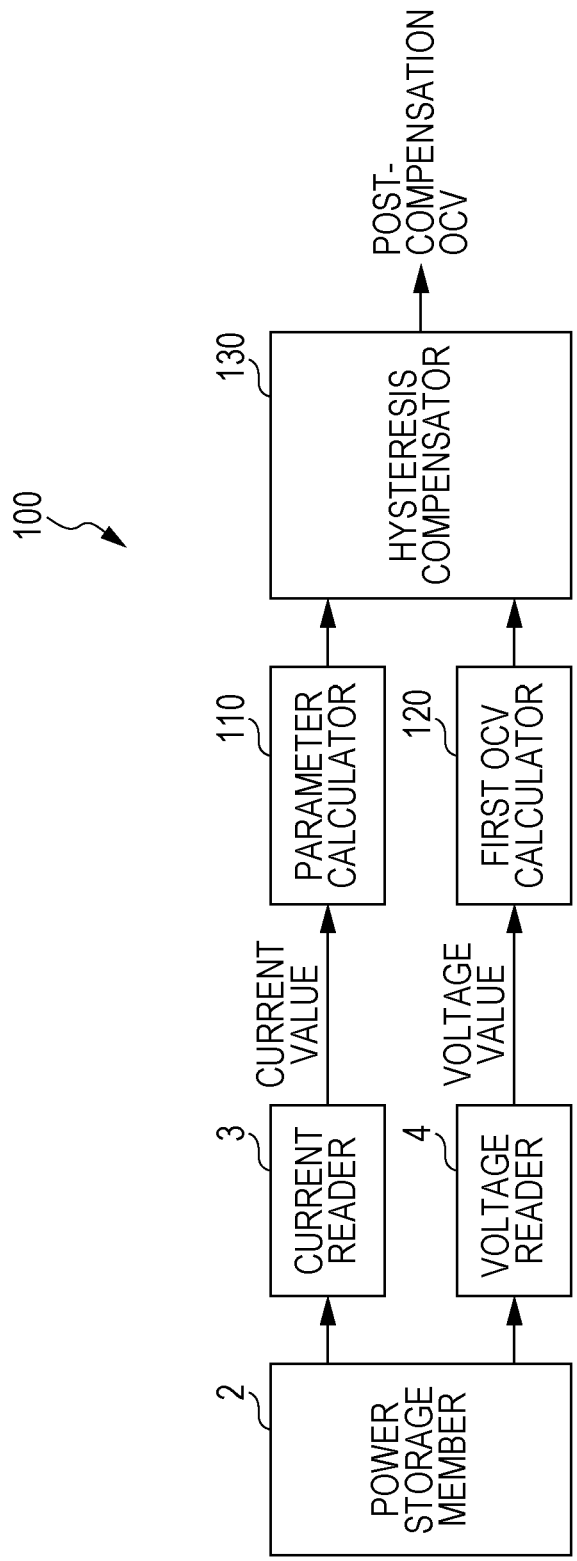
FIG. 1 is a block diagram showing a configuration example of a power storage member state estimation device of a first embodiment of the disclosure.

Hereafter, description will be given of favorable embodiments for realizing the present disclosure with reference to the drawings. The embodiments described below illustrate examples of representative embodiments of the disclosure and therefore should not be interpreted as restricting the scope of the disclosure. In each embodiment, constituent elements corresponding to one another are given the same reference numerals, and overlapping description thereof will not be made. Further, the description will be given in the following order.

1. First Embodiment (Example of Power Storage Member State Estimation Device that Performs Hysteresis Compensation of Open Circuit Voltage Based on Parameter Calculated from Current of Power Storage Member)

2. Second Embodiment (Example of Power Storage Member State Estimation Device that Sets Current High Frequency Direction, Average Current and ΔQ as Parameter and Calculates Hysteresis Compensation Considering Temperature)

3. Third Embodiment (Example of Power Storage Member State Estimation Device that Determines validity of Hysteresis Compensation of Open Circuit Voltage Before Compensation)

4. Fourth Embodiment (Example of Power Storage Member State Estimation Device that Estimates Charge State)

5. Fifth Embodiment (Example of Power Storage Member State Estimation Device that Estimates Open Circuit Voltage Curve)

6. First Modification Example of Fifth Embodiment (Example of Power Storage Member State Estimation Device that Improves Estimation Precision of Charge State Value Based on Open Circuit Voltage Curve)

7. Sixth Embodiment (Example of Power Storage Member State Estimation Device that Estimates Deterioration State Value)

8. Seventh Embodiment (Example of Power Storage Member State Estimation Device that Acquires Measurement Results of State of Power Storage Member State Estimation Device Through Communication)

9. Eighth Embodiment (Example of Battery Pack Including Power Storage Member State Estimation Device)

10. Ninth Embodiment (Example of Electric Vehicle Including Power Storage Member State Estimation Device)

11. Tenth Embodiment (Example of Power Storage Device Including Power Storage Member State Estimation Device)

1. First Embodiment

Configuration Example of Device

FIG. 1 is a block diagram showing a configuration example of a power storage member state estimation device 100 of the embodiment. The power storage member state estimation device 100 include, broadly classified, a parameter calculator 110, a first OCV calculator 120, and a hysteresis compensator 130, as shown in FIG. 1.

Parameter Calculator 110

The parameter calculator 110 has a configuration that acquires a current value of the power storage member 2. Although the parameter calculator 110 has a configuration in which the current value of the power storage member 2 read by a current reader 3 is directly or indirectly input as shown in FIG. 1, there is no limitation thereto. The parameter calculator 110 has a configuration that calculates the parameter based on the acquired current value.

The parameter is not limited to a specific form if applicable to the hysteresis compensation described later, and various parameters reflecting the charge and discharge history of the power storage member 2 may be employed.

The specific form of the parameter calculator 110 is not limited. For example, the parameter calculator 110 may include an electronic circuit. In this case the electronic circuit may include a digital circuit. In this case the parameter calculator 110 may include a processor or the like, such as a CPU (Central Processing Unit) or an MPU (Micro-Processing Unit). The program executed by the parameter calculator 110, that is, the power storage member state estimation program may be saved to a storage device, such as a ROM (Read Only Memory). The parameter calculator 110 may use a storage device, such as a RAM, as a working region when executing the power storage member state estimation program.

The specific form of the type, number, connection method or the like of the power storage member 2 is also not limited. The power storage member 2 may be a secondary battery or a hybrid capacitor. The secondary battery may be a lithium ion secondary battery. The lithium ion secondary battery may be a lithium ion secondary battery using an olivine-type iron phosphate as the cathode material.

The specific form of the current reader 3 is not limited. For example, the current reader 3 may be realized by a current measurement circuit or the like connected to the electrical path of the power storage member 2. The current reader 3 may be connected to the parameter calculator 110 and output the current value to the parameter calculator 110. The current reader 3 may be connected to a usage history storage device, not shown, and record the current value as a portion of the history information in the usage history storage device. In this case, the parameter calculator 110 may read the current value stored in the usage history storage device.

First OCV Calculator 120

The first OCV calculator 120 has a configuration that acquires a voltage value of the power storage member 2. Although the first OCV calculator 120 has a configuration in which the current value of the power storage member 2 read by a voltage reader 4 is directly or indirectly input as shown in FIG. 1, there is no limitation thereto. The first OCV calculator 120 has a configuration that calculates the open circuit voltage (below, referred to as OCV) of the power storage member 2 based on the acquired current value. Below, the OCV calculated by the first OCV calculator 120 is referred to as a pre-compensation OCV. The first OCV calculator 120 may use the current value of the pre-compensation OCV.

The specific method of calculating the pre-compensation OCV is not limited. For example, the pre-compensation OCV may be calculated based on the voltage data in a state with the current value 0 A of the power storage member 2. More specifically, while counting the time, the first OCV calculator 120 accumulates voltage data in a state with fixed time worth of the current value 0 A and may fit the current drop amount from the time 0 seconds with the following Equation 1.

$$A(1-e^{-Bt}) \quad (1)$$

Here, in Equation 1, t is the time, and A and B are fitting parameters. The first OCV calculator 120 may set a value reduced by A from the voltage at the time 0 seconds as the calculated value of the pre-compensation OCV.

The specific form of the first OCV calculator 120 is not limited. For example, the first OCV calculator 120 may include the parameter calculator 110 and an integrated or separate electronic circuit. The first OCV calculator 120 may realize the pre-compensation OCV calculation function by executing the power storage member state estimation program.

The specific form of the voltage reader 4 is not limited. For example, the voltage reader 4 may be realized by a current measurement circuit or the like connected to the electrical path of the power storage member 2. The voltage reader 4 may be connected to the first OCV calculator 120, and output the voltage value to the first OCV calculator 120. The voltage reader 4 may be connected to a usage history storage device, not shown, and record the current value as a portion of the history information in the usage history storage device. In this case, the first OCV calculator 120 may read the current value stored in the usage history storage device.

Hysteresis Compensator 130

The hysteresis compensator 130 has a configuration in which the parameter calculated by the parameter calculator 110 is input. The hysteresis compensator 130 has a configuration in which the pre-compensation OCV calculated by the first OCV calculator 120 is input. The hysteresis compensator 130 has a configuration that performs hysteresis compensation that reduces errors due to hysteresis (below, referred to as OCV hysteresis) of the input pre-compensation OCV based on the input parameter. OCV hysteresis refers to the shape of the OCV curve differing between a case in which the frequency of charging (in other words, the integrated value of the charge current) is higher than the frequency of discharging (in other words, the integrated value of the discharge current) and a case in which the frequency of discharging is higher than the frequency of charging, as described later. The hysteresis compensator 130 has a configuration in which the OCV after hysteresis compensation (below, referred to as post-compensation OCV) is output at a latter stage.

The specific form of the hysteresis compensation is not limited. For example, the hysteresis compensator 130 may calculate the compensation amount of the hysteresis compensation corresponding to the parameter by referring to a table with the parameter calculated by the parameter calculator 110 as arguments or by substituting the parameter in a function. The hysteresis compensator 130 may perform compensation of the pre-compensation OCV calculated by the first OCV calculator 120 based on the calculated compensation amount.

The specific form of the hysteresis compensator 130 is not limited. For example, the hysteresis compensator 130 may include a parameter calculator 110 or a first OCV calculator 120, or, alternatively, an electronic circuit integrated or separate from both. The hysteresis compensator 130 may realize the hysteresis compensation function by executing the power storage member state estimation program.

Operation Example of Device

Figure 2:
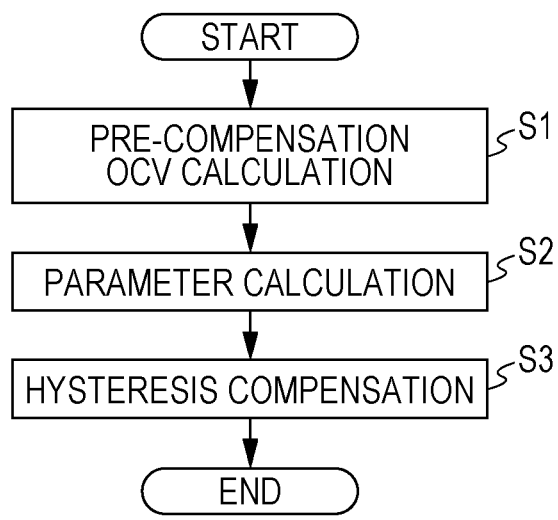
FIG. 2 is a flowchart showing an operation example of a power storage member state estimation device of the first embodiment of the disclosure.

FIG. 2 is a flowchart showing an operation example of a power storage member state estimation device 100 of the embodiment. The operation example shown in FIG. 2 is an embodiment of a power storage member state estimation method according to the disclosure. The trigger for the start of the operation example in FIG. 2 is not limited, and for example, may be a trigger such as the operation start of the power storage member state estimation device 100. However, the power storage member state estimation method according to the disclosure may be realized by a configuration other than the power storage member state estimation device 100.

Firstly, the pre-compensation OCV is calculated by the first OCV calculator 120 in step 1 (S1) in FIG. 2.

Next, in step 2 (S2), the parameter is calculated by the parameter calculator 110 based on the current value of the power storage member 2. Step 2 (S2) may be exchanged before or after step 1 (S1), or may be performed at the same time as step 1 (S1).

Next, in step 3, hysteresis compensation based on the parameter calculated in step 2 (S2) is performed by the hysteresis compensator 130 with respect to the pre-compensation OCV calculated in step 1 (S1).

According to the power storage member state estimation device 100 of the embodiment, it is possible to estimate the OCV with excellent precision taking the charge and discharge history into consideration by performing hysteresis compensation.

Figure 3:
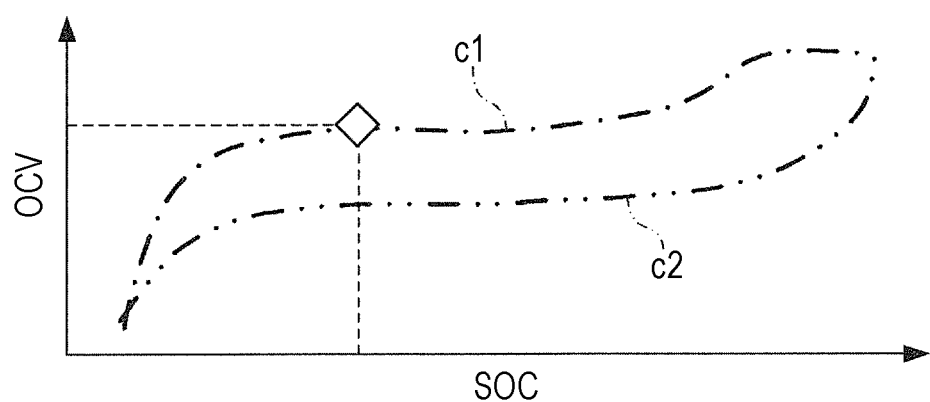
FIG. 3 is a graph of an open circuit voltage curve showing hysteresis of the open circuit voltage.

The OCV, that is, the sufficiently mitigated open-circuit voltage is extremely valid as a characteristic value that captures the state of the power storage member, and may be used in the estimation of the SOC or the deterioration state (SOH) of the power storage member. There are methods for estimating the SOC corresponding to the OCV estimated or actually measured by referencing a curve (hereinafter, referred to as a reference OCV curve) illustrating a correspondence relationship between an SOC acquired in advance and the OCV, as shown in FIG. 3, as methods for estimating the SOC. As shown in FIG. 3, the OCV has a shape that differs greatly between a case in which the frequency of charging is higher than the frequency of discharging (curve with dotted and dashed line) and a case in which the frequency of discharging is higher than the frequency of charging (curve with double-dotted and dashed line). This phenomenon is referred to as OCV hysteresis. In order to estimate the SOC with excellent precision, using different reference OCV curves according to the magnitude relationship between the frequency of charging and the frequency of charging is necessary. Referring to the example in FIG. 3, the first reference OCV curve c1 indicated by the dotted and dashed line is referred to in a case in which the frequency of charging is relatively high, and the second reference OCV curve c2 indicated by the double-dotted and dashed line is referred to in a case in which the frequency of discharging is relatively high. There are methods for estimating the SOH by fitting the shape of the reference OCV curve acquired in advance with respect to the shape of the estimated or measured OCV curve while being changed by compression or shifting as methods for estimating the SOH.

However, it is confirmed that there are cases in which the magnitude of the OCV hysteresis changes according to the charge and discharge history, and the OCV is accurately obtained according to the situation and cases where this does not happen.

Figure 4A:
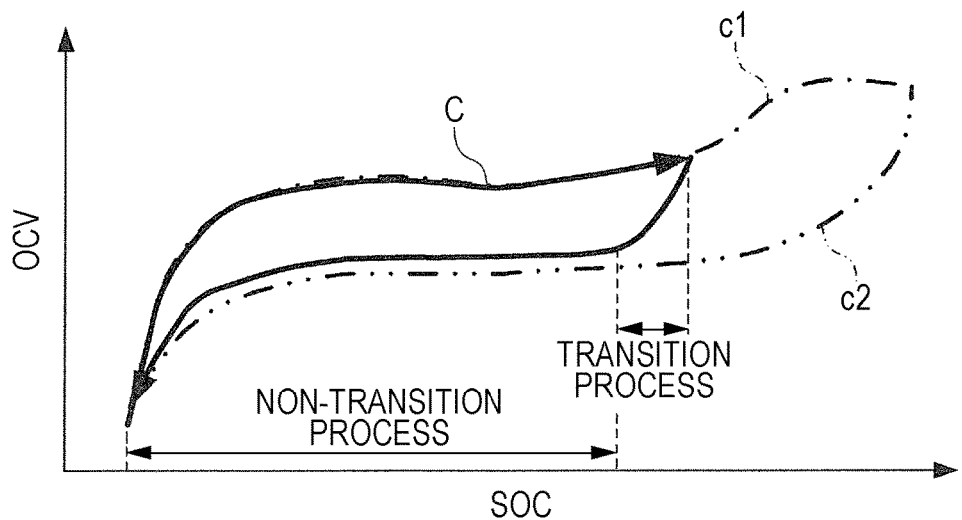
FIGS. 4A and 4B are graphs of an open circuit voltage curve illustrating a change in hysteresis of the open circuit voltage according to the charge and discharge history showing, respectively, a state of switching from midway through charging to discharging and a state of switching from midway through discharging to charging after switching from midway through charging to discharging.

Specifically, as shown in FIG. 4A, the actual OCV curve C and the reference OCV curve c1 substantially overlap in a case in which charging from a fully discharged state is successively performed at a higher frequency than discharging or a case in which discharging from the fully charged state is successively performed at a higher frequency than charging. In such cases, since it is possible to accurately estimate the SOC and the SOH from the OCV, the OCV becomes a highly precise, that is, a highly accurate value able to contribute to the estimation of an accurate SOC and SOH.

Figure 4B:
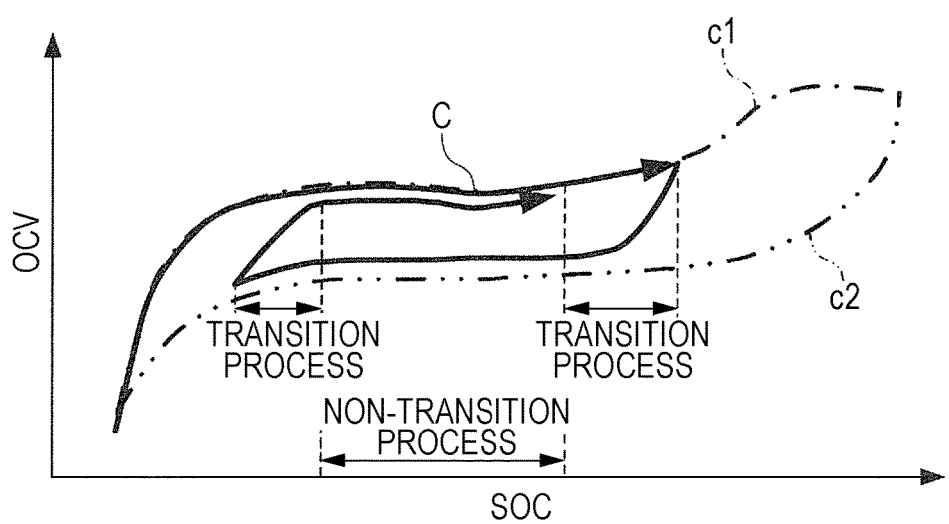

Meanwhile, in use of the power storage member 2, in particular, in-vehicle use, large scale power storage use, or the like, because the timing of entering the fully charged state or the fully discharged state is limited, constantly accurately estimating or measuring the OCV as described above is difficult. Accordingly, in practice, frequently switching between a state in which charging is performed at a higher frequency than discharging (that is, state in which charging is dominant) and a state in which discharging is performed at a higher frequency than charging (that is, a state is in which discharging is dominant) is common. In this way, in a process of transitioning (below, referred to as a transition process) from one state in which the frequency of charging or discharging is high to the other before reaching the fully charged or the fully discharged state, the OCV continuously changes from one reference OCV curve side to the other reference OCV curve side while exhibiting a non-linear shape. As shown in FIG. 4A, in the transition process, the shape of the actual OCV curve C and the shape of the reference OCV curve c2 differ greatly. Therefore, in a case in which the SOC is to be estimated by associating the OCV obtained in the transition process as is to the reference OCV curve c2, for example, even though the reference OCV curve c2 takes the OCV hysteresis into consideration, the estimation error for the SOC and the SOH increases. As shown in FIG. 4A, even in a process (below, referred to as a non-transition process) in which the state in which the frequency is high from the charging and discharging is not switched for a short time after the transition process, the state in which the actual OCV curve C and the reference OCV curve c2 diverge is continued. Therefore, even in a case in which the SOC is to be estimated by associating the OCV obtained in the non-transition process as is with the reference OCV curve c2, estimation errors in the SOC and the SOH arise. As shown in FIG. 4B, even in a case in which the direction in which the frequency is high from the charging and discharging is switched a plurality of times, similarly in a case in which the OCV is used as is in order to track the transition process and the non-transition process, estimation errors for the SOC and the SOH arise. In this way, the OCV obtained in the transition process and the non-transition process attains a value with poor precision because of the tendency to estimation errors in the SOC and the SOH.

Figure 5:
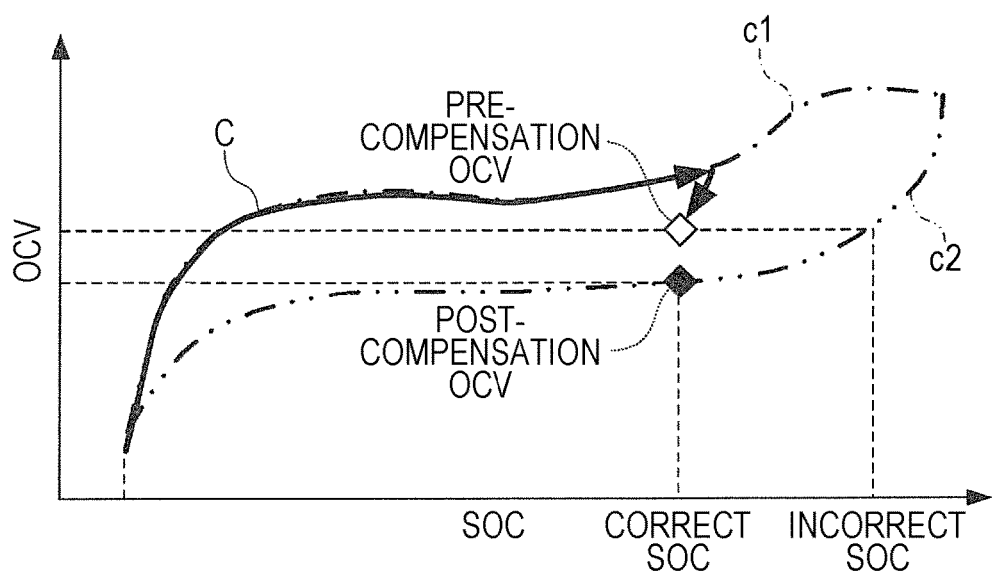
FIG. 5 is a schematic diagram showing hysteresis compensation.

In contrast, since it is possible to correct the pre-compensation OCV to the post-compensation OCV by performing hysteresis compensation as above, it is possible for the power storage member state estimation device 100 of the embodiment to estimate a highly precise OCV able to contribute to highly precise estimation of the SOC and SOH. For example, as shown in FIG. 5, even if the pre-compensation OCV is obtained in the transition step, since it is possible to associate the pre-compensation OCV with the reference OCV curve c2 by changing the post-compensation OCV, it is possible to obtain the correct SOC rather than an incorrect SOC obtained in a case in which the pre-compensation OCV is applied.

2. Second Embodiment

Configuration Example of Device

Figure 6:
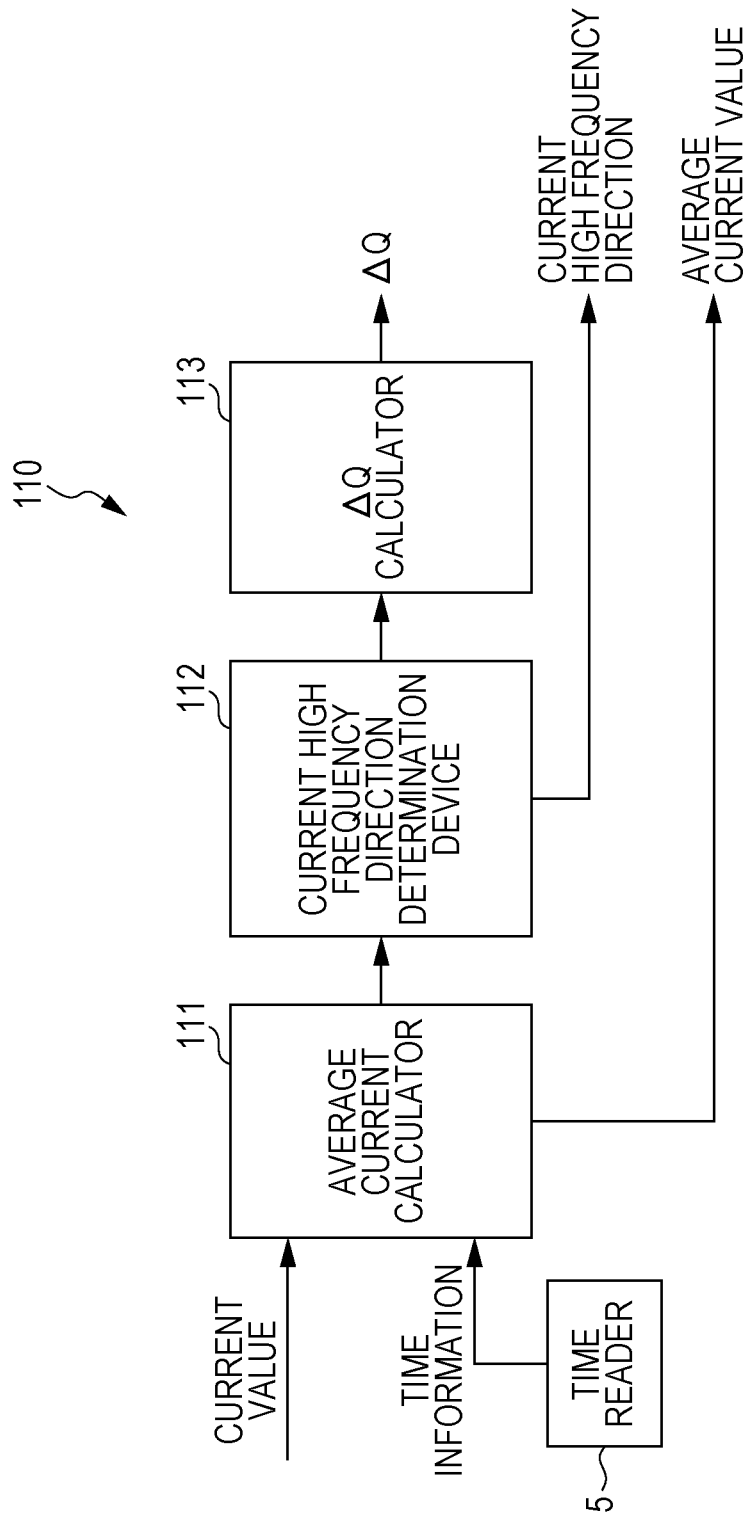
FIG. 6 is a block diagram showing a configuration example of parameter calculator in a power storage member state estimation device of a second embodiment of the disclosure.
Figure 7:
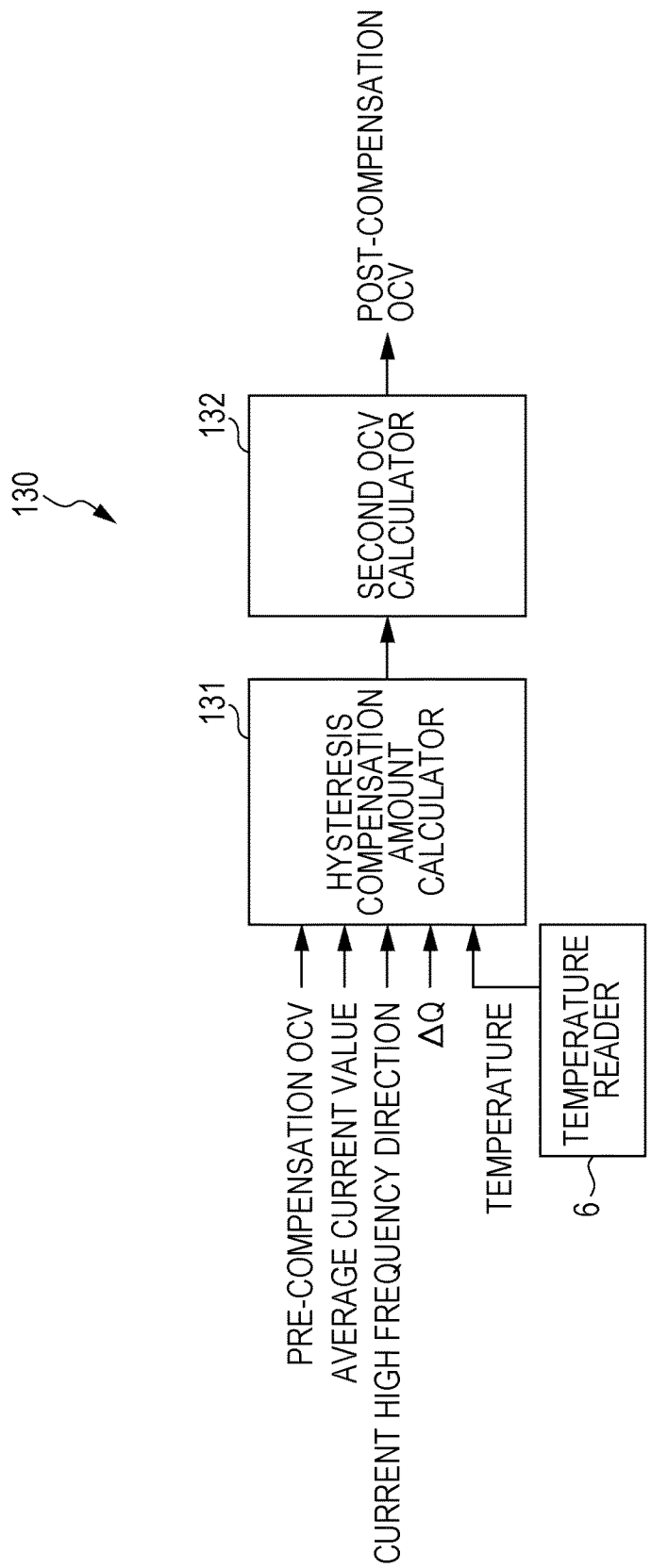
FIG. 7 is a block diagram showing a configuration example a hysteresis compensator in the power storage member state estimation device of the second embodiment of the disclosure.

FIGS. 6 and 7 are block diagrams showing a configuration example of a power storage member state estimation device 100 of the embodiment. The configuration of the parameter calculator 110 and the hysteresis compensator 130 of the power storage member state estimation device 100 of the embodiment are further specified with respect to the power storage member state estimation device 100 in FIG. 1. Hereinafter, a detailed description will be provided.

As shown in FIG. 6, the parameter calculator 110 of the embodiment includes an average current calculator 111, a current direction determination device 112, and a ΔQ calculator 113. As shown in FIG. 7, the hysteresis compensator 130 of the embodiment includes a hysteresis compensation amount calculator 131 and the second OCV calculator 132.

Average Current Calculator 111

The average current calculator 111 has a configuration to which the current value of the power storage member 2 and the time information are input. The average current calculator 111 has a configuration which calculates the average current value based on the input current value and time information. As shown in FIG. 6, the time information may be read by a time reader 5. The time necessary for calculation of the average current value, that is, the average current value, is not limited to being the average of the current value for a number of hours.

The specific form of the time reader 5 is not limited, and, for example, it is possible to employ various forms, such as a timing block of a processor. The time reader 5 may be connected to the average current calculator 111, and may output time information to the average current calculator 111. The time reader 5 may be connected to a usage history storage device, not shown, and record the time information as a portion of the history information in the usage history storage device. In this case, the average current calculator 111 may read the time information stored in the usage history storage device.

Current Direction Determination Device 112

The current direction determination device 112 has a configuration to which the average current value calculated by the average current calculator 111 is input. The current direction determination device 112 has a configuration that determines the direction (below, referred to as current high frequency direction) having a high frequency of current flowing in the direction of the current flowing in the power storage member 2 based on the input average current value. The current direction determination device 112 does not necessarily calculate the frequency itself, as long as the current direction determination device is able to determine the current high frequency direction based on the average current value. The determination results of the current high frequency direction are information that indicates the direction in which the current flows into the power storage member 2, that is, charging, or the direction in which the current flows out from the power storage member 2, that is, discharging. The determination period of the current high frequency direction is not limited, and for example, may be the necessary time for calculation of the average current value. Although the current direction determination device 112 determined the current high frequency direction to be the charging direction in cases in which the average current value is a positive value, and determines the current high frequency direction to be the discharge direction in cases in which the average current value is a negative value, there is no limit thereto. The disclosure does not exclude the current direction determination device 112 determining the current high frequency direction based on a parameter other than the average current value, such as the current integrated value. In a case of using the current integrated value, the current high frequency direction may be determined to be the charging direction in cases in which the current integrated value of the charging side is greater than the current integrated value of the discharging side, and the current high frequency direction may be determined to be the discharging direction in cases in which the current integrated value of the discharging side is greater than the current integrated value of the charging side.

ΔQ Calculator 113

The ΔQ calculator 113 has a configuration to which the determination results of the current high frequency side are input by the current direction determination device 112. The ΔQ calculator 113 has a configuration that calculates the charge and discharge capacity (below, referred to as ΔQ) after the current high frequency direction is switched based on the determination results of the input current high frequency direction. The ΔQ is the charging capacity after switching to charging in a case in which the current high frequency direction is switched from discharging to charging. The ΔQ is the discharge capacity after switching to discharging in a case in which the current high frequency direction is switched from charging to discharging. The ΔQ calculator 113 may further use the current value and the time information (for example, the time integral of the current, or the like) in the calculation of ΔQ.

Hysteresis Compensation Amount Calculator 131

The hysteresis compensation amount calculator 131 has a configuration in which the parameter calculated by the parameter calculator 110, that is, the average current value, the current high frequency direction and ΔQ, are input. The hysteresis compensation amount calculator 131 has a con-figuration that calculates the compensation amount (below, referred to as hysteresis compensation amount) of the hysteresis compensation based on the input parameter. The hysteresis compensation amount calculator 131 may also use a parameter other than the calculation results of the parameter calculator 110, such as the temperature of the power storage member 2 in the calculation of the hysteresis compensation amount. Although FIG. 7 shows a form in which the temperature of the power storage member 2 read by the temperature reader 6 is input to the hysteresis compensation amount calculator 131, the disclosure is not limited thereto. The temperature reader 6 may be realized by a temperature measurement circuit, or the like. The temperature reader 6 may be connected to the hysteresis compensation amount calculator 131 and output the temperature to the hysteresis compensation amount calculator 131. The temperature reader 6 may be connected to a usage history storage device, not shown, and record the temperature as a portion of the history information in the usage history storage device. In this case, the hysteresis compensation amount calculator 131 may read the temperature stored in the usage history storage device.

FIGS. 8A and 8B show a table of the hysteresis compensation amount associated with the parameter as an example of the reference data for the hysteresis compensation amount calculation. FIG. 8A is a table of a case in which the direction of the current high frequency direction is discharging, that is, the sign of the current is negative. FIG. 8B is a table of a case in which the direction of the current high frequency direction is charging, that is, the sign of the current is positive. The hysteresis compensation amount ΔV [V] in each table is associated with the average current value, the ΔQ, and the temperature (here, $T=T_1$). The hysteresis compensation amount may further be associated with the estimated value of the SOC. The hysteresis compensation amount calculator 131 may calculate the hysteresis compensation amount by unambiguously extracting the hysteresis compensation amount corresponding to the parameter with reference to the table in FIG. 8. The hysteresis compensation amount calculator 131 may calculate the hysteresis compensation amount by an interpolation process such as linear interpolation in cases in which a hysteresis compensation amount matching the parameter is not present in the table.

Figure 9:
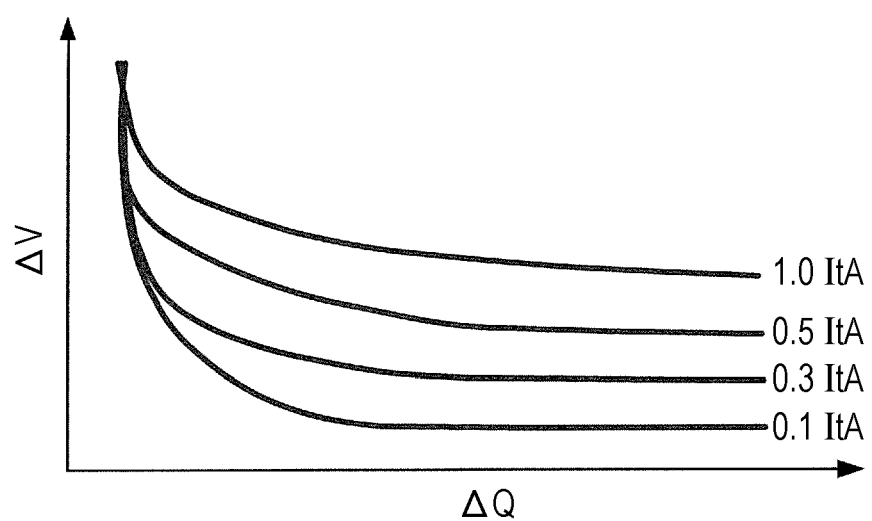
FIG. 9 is a schematic diagram showing a table in which the relationship of the compensation value of the hysteresis compensation associated with the average current, $\Delta Q$, and the temperature is recorded as a configuration example of the power storage member state estimation device of the second embodiment of the disclosure.

FIG. 9 shows a table of the hysteresis compensation amount associated with the parameter as an example other than FIGS. 8A and 8B of the reference data for the hysteresis compensation amount calculation. The function in FIG. 9 is a function for each average current value (ItA) in the temperature $T_1$ with the horizontal axis set as ΔQ and the vertical axis as the hysteresis compensation amount ΔV. The hysteresis compensation amount calculator 131 may calculate the hysteresis compensation amount by substituting the parameter in the function in FIG. 9. The calculation of the hysteresis compensation amount is not limited being performed with reference to a table or a function. The reference data for hysteresis compensation amount calculation may be stored by the hysteresis compensation amount calculator 131, or may be stored in a storage device other than the hysteresis compensation amount calculator 131.

The hysteresis compensation amount calculator 131 may use the reference data for hysteresis compensation amount calculation by changing a numerical value based on the SOH estimated with an arbitrary method. A method such as multiplying each value in the table by 1.1 or the like, for example, when the charging capacity is reduced by 10% is given as an example of the method for changing the numerical value, the disclosure is not limited thereto.

Second OCV Calculator 132

The second OCV calculator 132 has a configuration in which the hysteresis compensation amount calculated by the hysteresis compensation amount calculator 131 is input. The second OCV calculator 132 has a configuration that calculates the post-compensation OCV using the input hysteresis compensation amount. The calculation of the post-compensation OCV may be performed according equation 2 below.

$$Va = Vb + \Delta V \quad (2)$$

Here, Va in the equation is the post-compensation OCV. Vb is the pre-compensation OCV. ΔV is the hysteresis compensation amount.

The second OCV calculator 132 has a configuration that outputs the calculated post-compensation OCV at a latter stage. The calculation of the post-compensation OCV is not limited to adding the hysteresis compensation amount to the pre-compensation OCV.

Operation Example of Device

Figure 10:
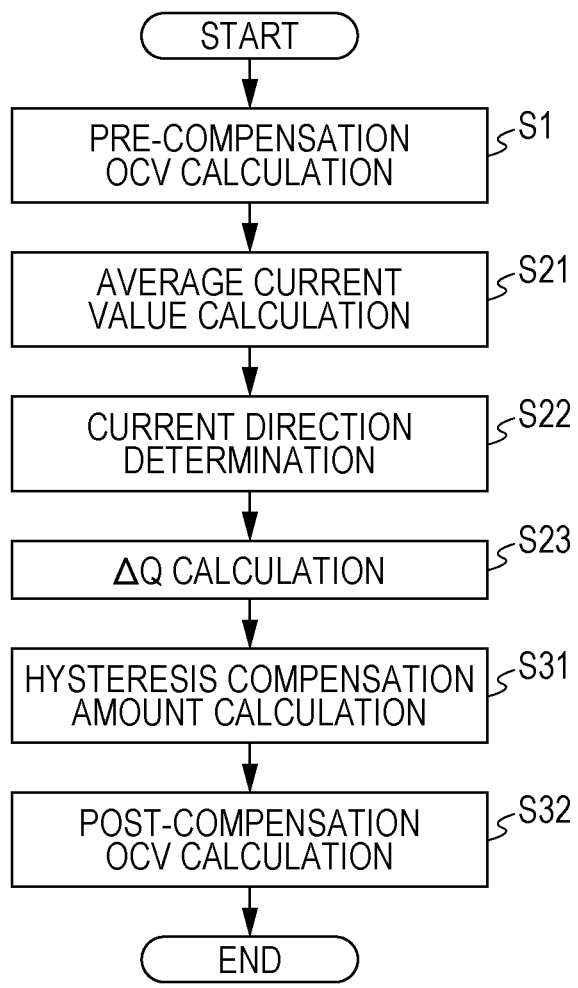
FIG. 10 is a flowchart showing an operation example of the power storage member state estimation device of the second embodiment of the disclosure.

FIG. 10 is a flowchart showing an operation example of a power storage member state estimation device 100 of the embodiment. The operation example shown in FIG. 10 is an embodiment of a power storage member state estimation method according to the disclosure.

In the embodiment, the series of step 21 (S21) to step 23 (S23) is executed as a specific example of step 2 (S2) in FIG. 2. In the embodiment, the series of step 31 (S31) to step 32 (S32) is executed as a specific example of step 3 (S3) in FIG. 2.

More specifically, in step 21 (S21), the average current value of the power storage member 2 is calculated by the average current calculator 111 based on the current value and the time information.

In step 22 (S22) the current high frequency direction is determined by the current direction determination device 112 based on the average current value calculated in step 21 (S21).

In step 23 (S23), switching of the current high frequency direction, that is, charging and discharging, is detected based on the current high frequency direction determined by the ΔQ calculator 113 in step 22 (S22), and ΔQ is calculated based on the current value and the time information acquired after switching.

In step 31 (S31), the hysteresis compensation amount is calculated based on each parameter calculated in steps 21 to 23 (S21 to S23) and other parameters (temperature or the like) as necessary by the hysteresis compensation amount calculator 131.

In step 32 (S32), the post-compensation OCV is calculated based on the hysteresis compensation amount calculated in step 31 (S31) by the second OCV calculator 132.

According to the embodiment, it is possible to exhibit the same effects as the power storage member state estimation device 100 in FIG. 1, or to improve the precision of the hysteresis compensation based on a parameter that reflects changes in the OCV hysteresis, such as the average current value, the current high frequency direction or the ΔQ. The parameter associated with the hysteresis compensation amount may be at least one of, rather than all of, the average current value, the current high frequency direction, and the ΔQ. Other parameters further associated with the hysteresis compensation amount may be at least one of the current value of the power storage member, the temperature and the SOC estimation value of the power storage member 2. In these cases, it is possible to improve the precision of the hysteresis compensation.

3. Third Embodiment

Configuration Example of Device

Figure 11:
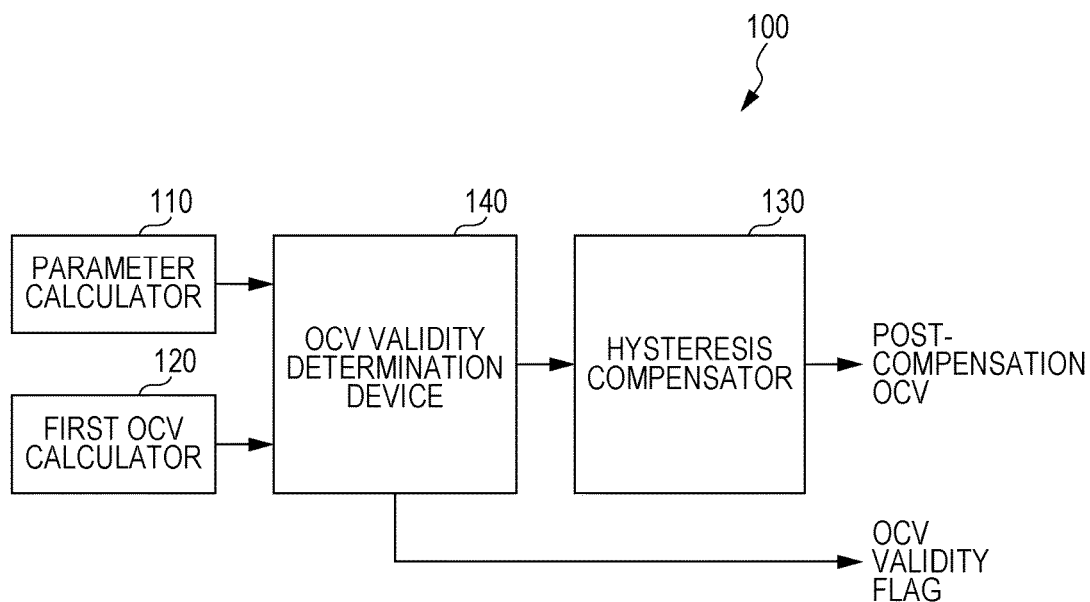
FIG. 11 is a block diagram showing a configuration example of the power storage member state estimation device of a third embodiment of the disclosure.

FIG. 11 is a block diagram showing a configuration example of a power storage member state estimation device 100 of the embodiment. The configuration with respect to the power storage member state estimation device 100 in FIG. 1 is added to the power storage member state estimation device 100 of the embodiment.

More specifically, as shown in FIG. 11, the power storage member state estimation device 100 of the embodiment includes an OCV validity determination device 140 in addition to the configuration in FIG. 1.

OCV Validity Determination Device 140

The OCV validity determination device 140 has a configuration in which that parameter calculated by the parameter calculator 110 and the pre-compensation OCV calculated by the first OCV calculator 120 are input. The OCV validity determination device 140 has a configuration that performs determination (below, referred to as OCV validity determination) of whether or not the input pre-compensation OCV is valid as a target of the hysteresis compensation based on the input parameter. The OCV validity determination device 140 has a configuration that associates an OCV validity flag indicating the results of the OCV validity determination with the pre-compensation OCV. For example, although the OCV validity determination device 140 may set the OCV validity flag to [1] by associating with the pre-compensation OCV in a case in which the pre-compensation OCV is valid, there is no limitation thereto. Although the OCV validity determination device 140 may set the OCV validity flag to [0] by associating with the pre-compensation OCV in a case in which the pre-compensation OCV is valid, there is no limitation thereto. Setting the OCV validity flag may be performed using a storage region in the OCV validity determination device 140 or external to the OCV validity determination device 140.

The hysteresis compensator 130 has a configuration that detects a valid pre-compensation OCV by reading the OCV validity flag, and performs hysteresis compensation with the detected valid pre-compensation OCV as a target. The hysteresis compensator 130 has a configuration that awaits the hysteresis compensation until a valid pre-compensation OCV is detected in a case in which the pre-compensation OCV is not valid.

Figure 12:
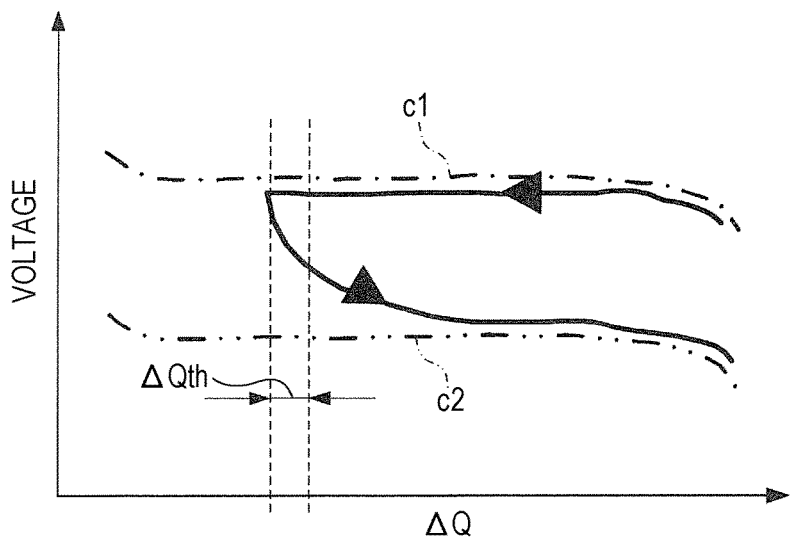
FIG. 12 is a schematic diagram showing the validity determination of the open circuit voltage based on $\Delta Q$.

The specific form of the OCV validity determination is not limited. For example, the OCV validity determination device 140 may set whether or not ΔQ exceeds a threshold ΔQth as a determination reference in a case of performing the OCV validity determination based on ΔQ as shown in FIG. 12, and may output the OCV validity flag indicating validity in cases in which ΔQ exceeds the threshold ΔQth. In this case, since it is possible to exclude the pre-compensation OCV of the initial start of the transition process that is susceptible to errors from the target of the hysteresis compensation, it is possible to further improve the precision of the hysteresis compensation. The OCV validity determination is not limited to being based on ΔQ. The OCV validity determination may be performed based on at least one of the calculation results of the parameter calculator 110, the current value, the temperature, and the SOC estimation value other than the ΔQ.

The specific form of the OCV validity determination device 140 is not limited. For example, the OCV validity determination device 140 may include electronic circuit integrated with or separate to at least one of a parameter calculator 110, a first OCV calculator 120, and a hysteresis compensator 130. The OCV validity determination device 140 may realize the OCV validity determination function by executing the power storage member state estimation program.

Operation Example of Device

Figure 13:
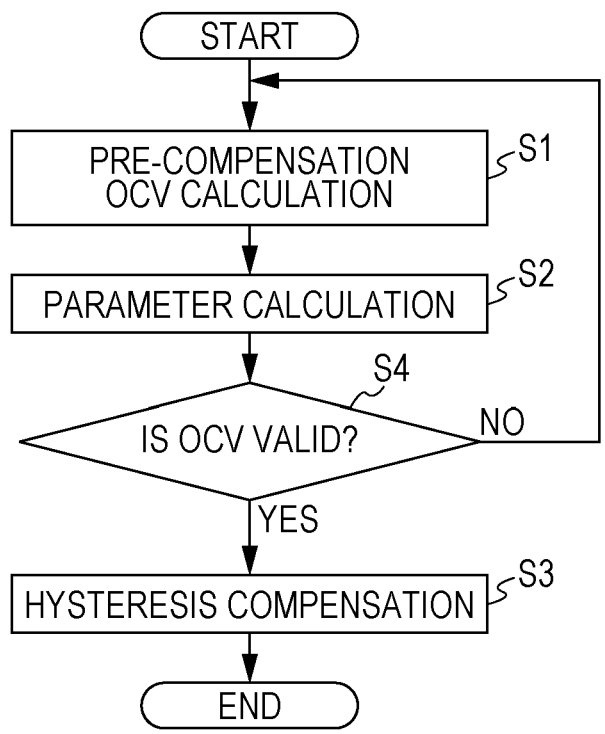
FIG. 13 is a flowchart showing an operation example of the power storage member state estimation device of the third embodiment of the disclosure.

FIG. 13 is a flowchart showing an operation example of a power storage member state estimation device 100 of the embodiment. The operation example shown in FIG. 13 is an embodiment of a power storage member state estimation method according to the disclosure.

The embodiment has the process with respect to FIG. 2 added thereto. More specifically, as shown in FIG. 13, in the embodiment, step 4 (S4) is executed between step 2 (S2) and step 3 (S3) in FIG. 2. In step 4 (S4), OCV validity determination is performed by the OCV validity determination device 140. In a case in which a positive determination result is obtained, the process proceeds to step 3 (S3), and in a case in which a negative determination result is obtained, the process returns to step 1 (S1).

According to the embodiment, it is possible to exhibit the same effects as the power storage member state estimation device 100 in FIG. 1, or possible to further improve the precision of the hysteresis compensation.

4. Fourth Embodiment

Configuration Example of Device

Figure 14:
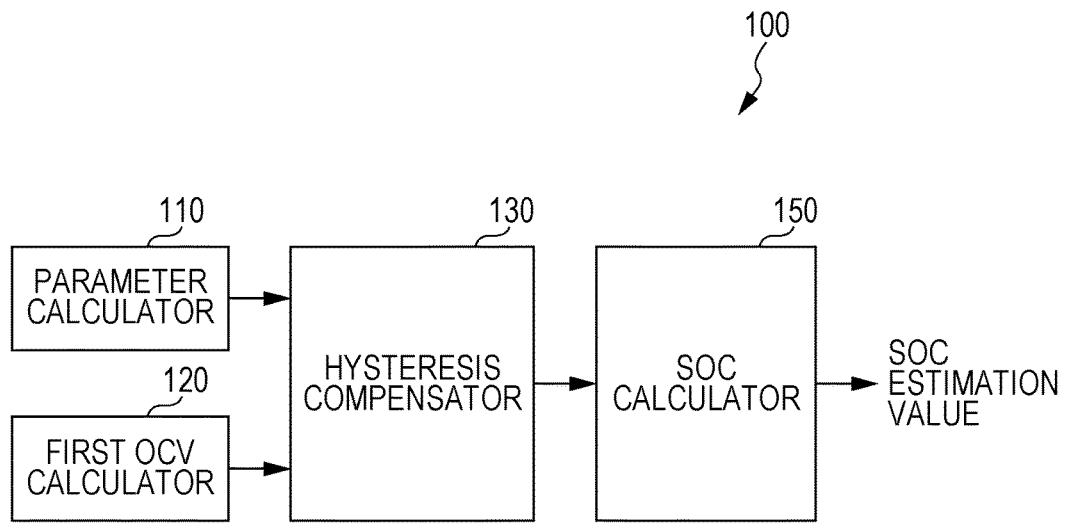
FIG. 14 is a block diagram showing a configuration example of the power storage member state estimation device of a fourth embodiment of the disclosure.

FIG. 14 is a block diagram showing a configuration example of a power storage member state estimation device 100 of the embodiment. The configuration with respect to the power storage member state estimation device 100 in FIG. 1 is added to the power storage member state estimation device 100 of the embodiment.

More specifically, as shown in FIG. 14, the power storage member state estimation device 100 of the embodiment includes an SOC calculator 150 in addition to the configuration in FIG. 1.

SOC Calculator 150

The SOC calculator 150 has a configuration that calculates the post-compensation OCV output from the hysteresis compensator 130. The SOC calculator 150 has a configuration that calculates, that is, estimates, the SOC based on the input post-compensation OCV. The SOC calculation may be performed by associating the post-compensation OCV with the reference OCV curve shown in FIG. 3. The reference OCV curve may be stored in the SOC calculator 150, or may be stored in a storage device other than the SOC calculator 150.

The specific form of the SOC calculator 150 is not limited. For example, the SOC calculator 150 may include an electronic circuit integrated with or separate to at least one of a parameter calculator 110, a first OCV calculator 120, and a hysteresis compensator 130. The SOC calculator 150 may realize the SOC calculation function by executing the power storage member state estimation program.

Operation Example of Device

Figure 15:
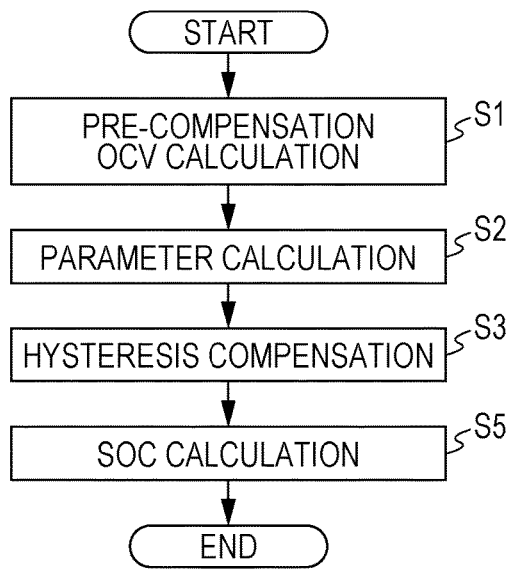
FIG. 15 is a flowchart showing an operation example of the power storage member state estimation device of the fourth embodiment of the disclosure.

FIG. 15 is a flowchart showing an operation example of a power storage member state estimation device 100 of the embodiment. The operation example shown in FIG. 15 is an embodiment of a power storage member state estimation method according to the disclosure.

The embodiment has the process with respect to FIG. 2 added thereto. More specifically, as shown in FIG. 15, in the embodiment, step 5 (S5) is executed after step 3 (S3) in FIG. 2. In step 5 (S5), the SOC is calculated using the post-compensation OCV and the reference OCV curve by the SOC calculator 150.

According to the embodiment, it is possible to suitably estimate the correct SOC as shown in FIG. 5, even in cases, for example, of either of the transition process or the non-transition process (refer to FIG. 4) by using the highly precise post-compensation OCV.

5. Fifth Embodiment

Configuration Example of Device

Figure 16:
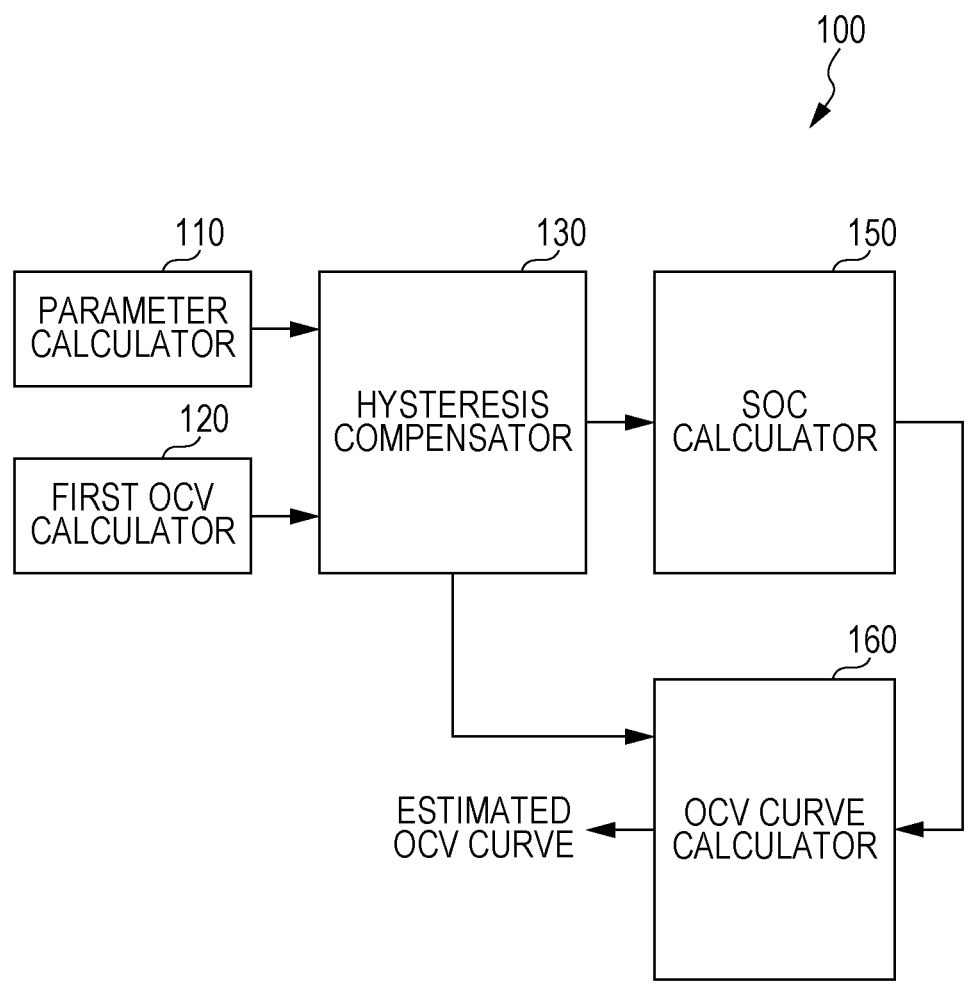
FIG. 16 is a block diagram showing a configuration example of the power storage member state estimation device of a fifth embodiment of the disclosure.

FIG. 16 is a block diagram showing a configuration example of a power storage member state estimation device 100 of the embodiment. The configuration with respect to the power storage member state estimation device 100 in FIG. 14 is added to the power storage member state estimation device 100 of the embodiment.

More specifically, as shown in FIG. 16, the power storage member state estimation device 100 of the embodiment includes an OCV curve calculator 160 in addition to the configuration in FIG. 14.

OCV Curve Calculator 160

The OCV curve calculator 160 has a configuration in which the post-compensation OCV output from the hysteresis compensator 130 is input. The OCV curve calculator 160 has a configuration in which the SOC estimated by the SOC calculator 150 is input. The OCV curve calculator 160 has a configuration that calculates the OCV curve (below, referred to as the estimated OCV curve) based on the input post-compensation OCV and the SOC.

Figure 17:
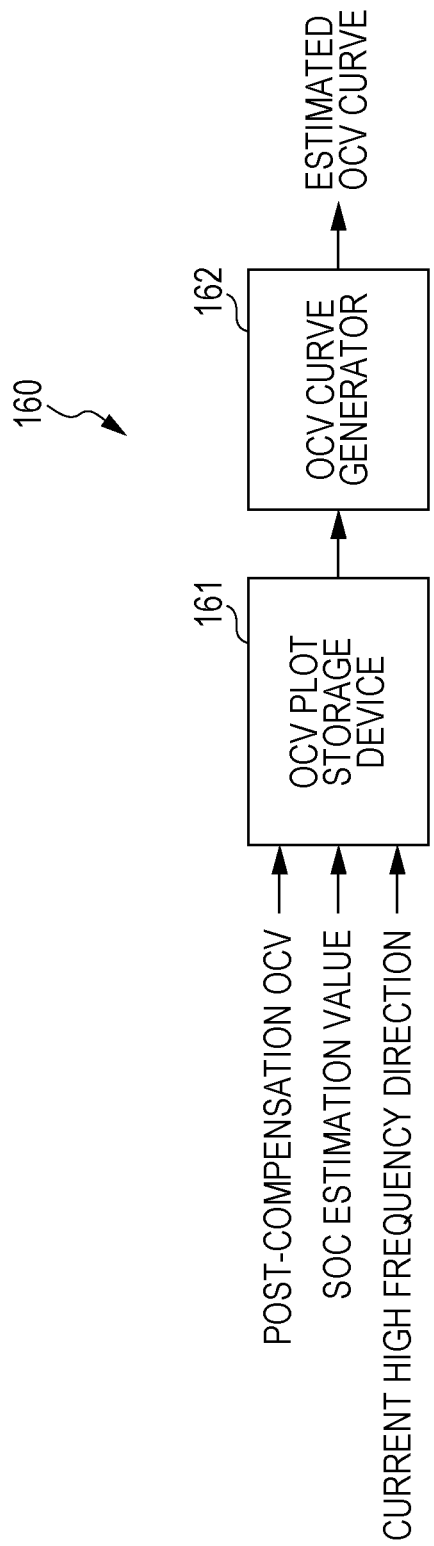
FIG. 17 is a block diagram showing a configuration example of OCV curve calculator of the power storage member state estimation device of the fifth embodiment of the disclosure.

FIG. 17 shows a more specific configuration of the OCV curve calculator 160. As shown in FIG. 17, the OCV curve calculator 160 includes an OCV plot storage device 161 and an OCV curve generator 162.

OCV Plot Storage Device 161

The OCV plot storage device 161 has a configuration in which the post-compensation OCV from the hysteresis compensator 130 is input. The OCV curve calculator 160 has a configuration in which the SOC from the SOC calculator 150 is input. The OCV curve calculator 160 has a configuration in which the current high frequency direction calculated by the parameter calculator 110 is input. The OCV plot storage device 161 has a configuration that forms an OCV plot from the input post-compensation OCV, SOC, and the current high frequency direction, and stores the result as a set. The OCV curve calculator 160 has a configuration that separates the OCV plot into charging and discharging according to the current high frequency direction and stores the result.

OCV Curve Calculator 162

The OCV curve generator 162 has a configuration that creates the estimated OCV curve based on the OCV plot stored in the OCV plot storage device 161. More specifically, the OCV curve generator 162 generates the estimated OCV curve of the charging side based on the OCV plot in which the current high frequency direction is positive. The OCV curve generator 162 generates the estimated OCV curve of the discharging side based on the OCV plot in which the current high frequency direction is negative. That is, the OCV curve generator 162 has a configuration that generates two estimated OCV curve according to differences in the current high frequency direction.

The specific form of the OCV curve calculator 160 is not limited. For example, the OCV curve calculator 160 may include an electronic circuit integrated with or separate to at least one of a parameter calculator 110, a first OCV calculator 120, a hysteresis compensator 130, and an SOC calculator 150. The OCV curve calculator 160 may realize the function of calculating the estimated OCV curve by executing the power storage member state estimation program.

Operation Example of Device

Figure 18:
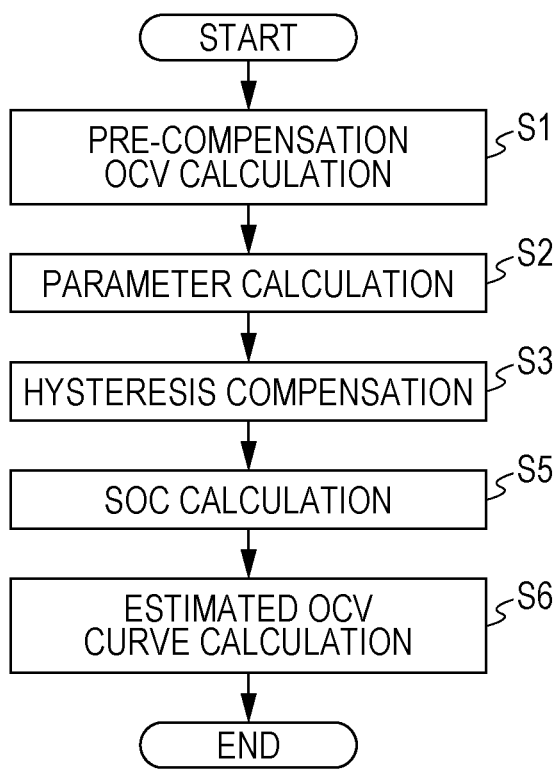
FIG. 18 is a flowchart showing an operation example of the power storage member state estimation device of the fifth embodiment of the disclosure.

FIG. 18 is a flowchart showing an operation example of a power storage member state estimation device 100 of the embodiment. The operation example shown in FIG. 18 is an embodiment of a power storage member state estimation method according to the disclosure.

The embodiment has the process with respect to FIG. 15 added thereto. More specifically, as shown in FIG. 18, in the embodiment, step 6 (S6) is executed after step 5 (S5) in FIG. 15. In step 6 (S6), the estimated OCV curve is calculated by the OCV curve calculator 160 based on the post-compensation OCV, the current high frequency direction, and the SOC. Although Step 6 (S6) may take the opportunity to acquire a sufficient number of OCV plots by repeating steps 1 to 5 (S1 to S5) to a threshold count, there is no limitation thereto.

According to the embodiment, it is possible to exhibit the same effects as the power storage member state estimation device 100 in FIG. 14, or possible to highly precisely estimate the OCV curve based on the highly precise post-compensation OCV and based on the SOC estimated with high precision based thereupon. By obtaining two OCV curves with reference to the current high frequency direction, it is possible to further improve the estimation precision of the OCV curve.

6. First Modification Example of Fifth Embodiment

Configuration Example of Device

Figure 19:
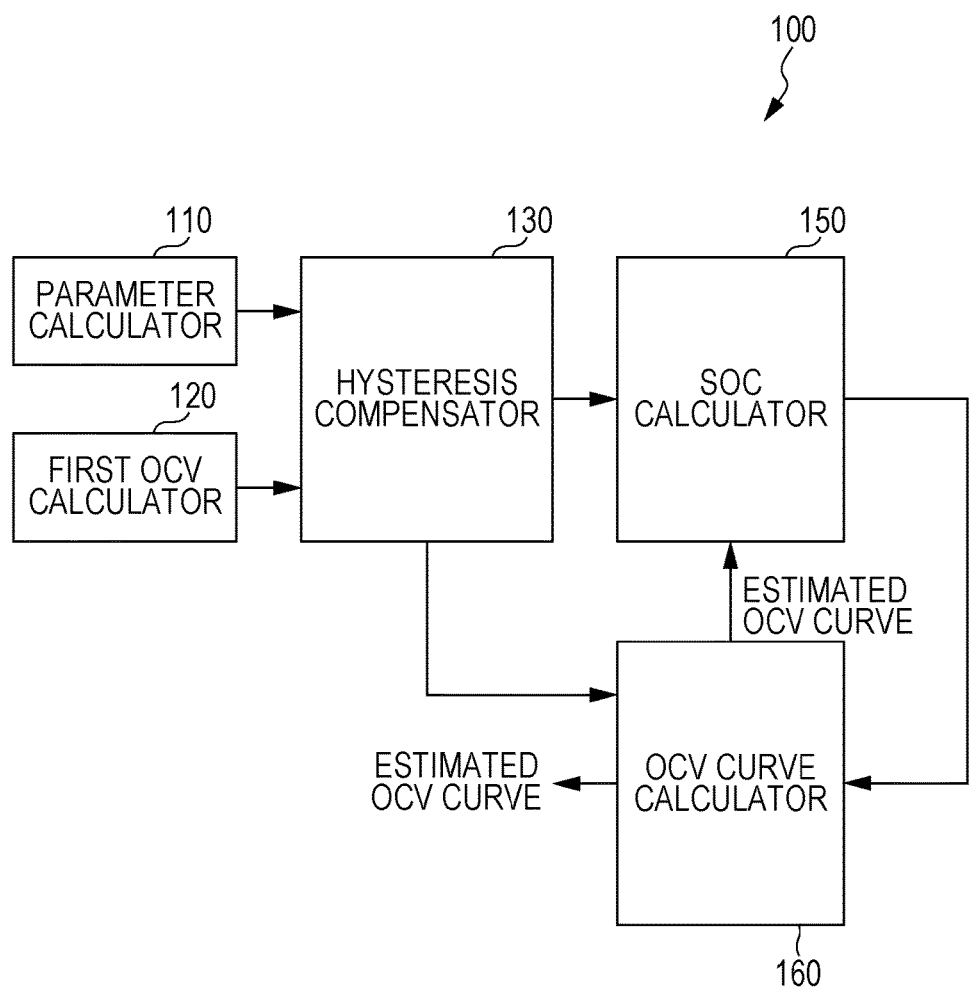
FIG. 19 is a block diagram showing a configuration example of the power storage member state estimation device of a first modification example of the fifth embodiment of the disclosure.

FIG. 19 is a block diagram showing a configuration example of a power storage member state estimation device 100 of the modification example. The power storage member state estimation device 100 of the modification example further specifies the configuration of the SOC calculator 150 with respect to the power storage member state estimation device 100 in FIG. 16.

More specifically, as shown in FIG. 19, the power storage member state estimation device 100 of the modification example has a configuration in which the OCV curve calculator 160 outputs the estimated OCV curve to the SOC calculator 150. The SOC calculator 150 has a configuration that uses the estimated OCV curve input from the OCV curve calculator 160 as the reference OCV curve (refer to FIG. 3). The SOC calculator 150 may use the input estimated OCV curve itself as the reference OCV curve, or may use a processed estimated OCV curve as the reference OCV curve. The SOC calculator 150 may designate the estimated OCV curve or a processed form thereof as the reference curve newly used in place of the reference OCV curve currently used. Although this designation may be performed by recording the flag showing use as the reference OCV curve in association with the estimated OCV curve or a processed form thereof, there is no limitation thereto.

Operation Example of Device

Figure 20:
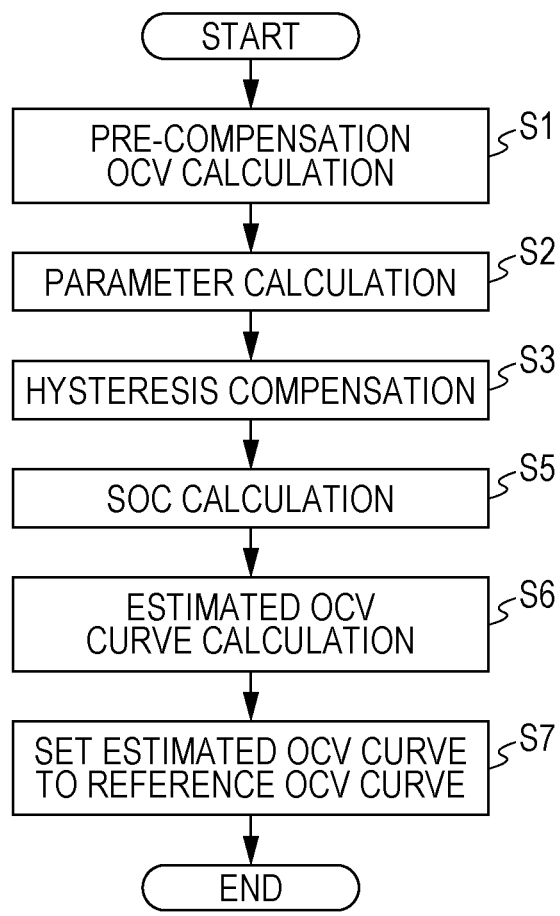
FIG. 20 is a flowchart showing an operation example of the power storage member state estimation device of the first modification example of the fifth embodiment of the disclosure.

FIG. 20 is a flowchart showing an operation example of a power storage member state estimation device 100 of the modification. The operation example shown in FIG. 20 is an embodiment of a power storage member state estimation method according to the disclosure.

The modification example has the processes with respect to FIG. 18 added thereto. More specifically, as shown in FIG. 20, step 7 (S7) is executed after step 6 (S6) in FIG. 18. In step 7 (S7), the estimated OCV curve calculated in step 6 (S6) is set as the reference OCV curve newly used in the calculation of the SOC by the SOC calculator 150.

According to the embodiment, it is possible to exhibit the same effects as the power storage member state estimation device 100 in FIG. 16, alternatively, since it is possible to use the estimated OCV reference curve as the reference OCV curve, it is possible to accurately estimate the SOC even in cases in which the OCV curve is changed by the power storage member 2 deteriorating. It is possible for a more accurate OCV plot to be calculated by estimation of an accurate SOC, and, because it is possible to calculate an accurate OCV curve, it is possible to persistently realize highly precise SOC estimation and SOH estimation.

7. Sixth Embodiment

Configuration Example of Device

Figure 21:
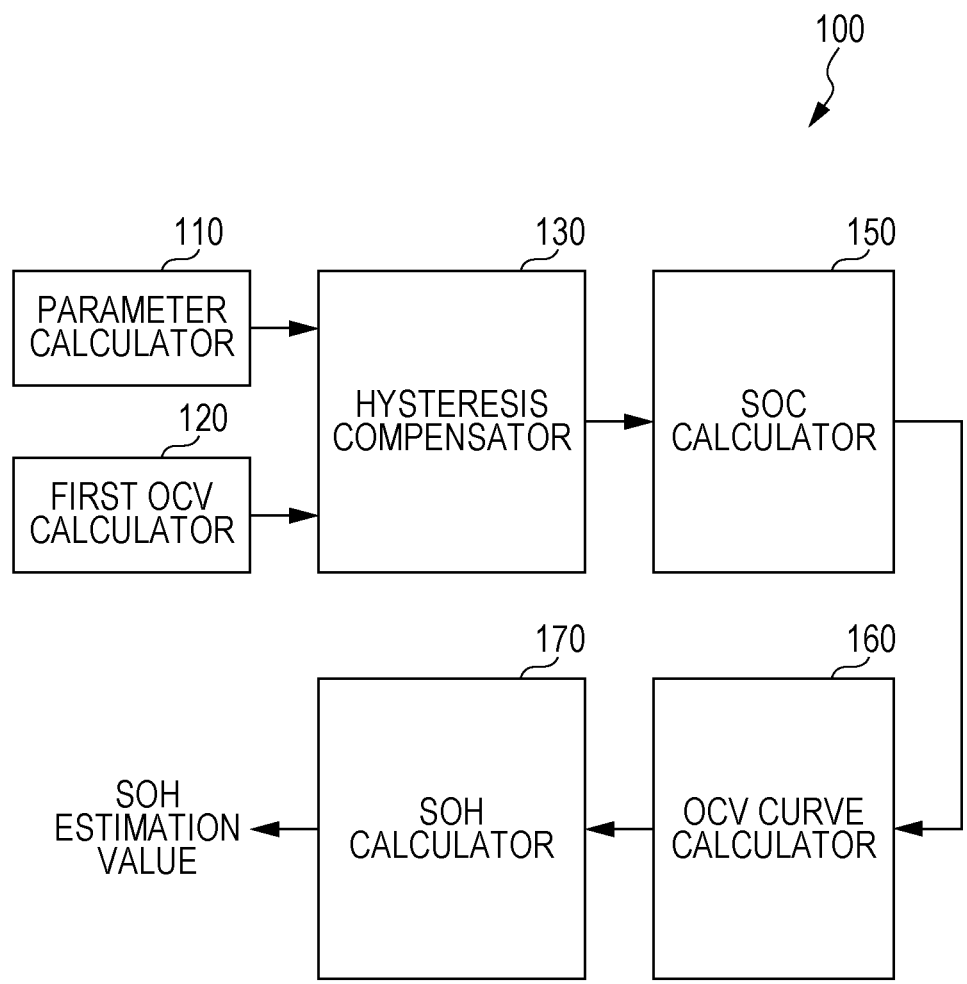
FIG. 21 is a block diagram showing a configuration example of the power storage member state estimation device of a sixth embodiment of the disclosure.

FIG. 21 is a block diagram showing a configuration example of a power storage member state estimation device 100 of the embodiment. The configuration with respect to the power storage member state estimation device 100 in FIG. 16 is added to the power storage member state estimation device 100 of the embodiment.

More specifically, as shown in FIG. 21, the power storage member state estimation device 100 of the embodiment includes an SOH calculator 170 in addition to the configuration in FIG. 16.

SOH Calculator 170

The SOH calculator 170 has a configuration in which the calculation results of the estimated OCV curve are input by the OCV curve calculator 160. The SOH calculator 170 has a configuration that calculates the SOH based on the input estimated OCV curve. Although the SOH calculator 170 may estimate the SOH by fitting the shape of the reference OCV curve to the estimated OCV curve while being changed by compressing of shifting, the disclosure is not limited thereto.

The specific form of the SOH calculator 170 is not limited. For example, the SOH calculator 170 may include electronic circuit integrated with or separate to at least one of a parameter calculator 110, a first OCV calculator 120, a hysteresis compensator 130, an SOC calculator 150, and an OCV curve calculator 160. The SOH calculator 170 may realize the SOH calculation function by executing the power storage member state estimation program.

Operation Example of Device

Figure 22:
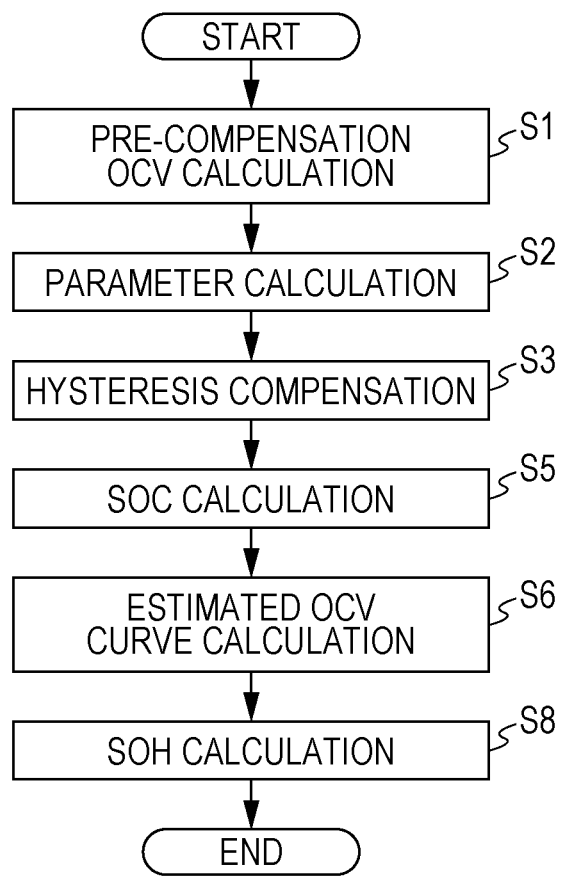
FIG. 22 is a flowchart showing an operation example of the power storage member state estimation device of the sixth embodiment of the disclosure.

FIG. 22 is a flowchart showing an operation example of a power storage member state estimation device 100 of the embodiment. The operation example shown in FIG. 22 is an embodiment of a power storage member state estimation method according to the disclosure.

The embodiment has the process with respect to FIG. 18 added thereto. More specifically, as shown in FIG. 22, in the embodiment, step 8 (S8) is executed after step 6 (S6) in FIG. 18. In step 8 (S8), the SOH is calculated by the SOH calculator 170 based on the estimated OCV curve calculated in step 6 (S6).

According to the embodiment, it is possible to exhibit the same effects as the power storage member state estimation device 100 in FIG. 16, or possible to highly precisely estimate the SOH by using a highly precise estimated OCV curve.

8. Seventh Embodiment

Configuration Example of Device

The configuration with respect to the power storage member state estimation device 100 in FIG. 14 is further specified in the power storage member state estimation device 100 of the embodiment. More specifically, the power storage member state estimation device 100 of the embodiment has a configuration that performs calculation of the state value of the power storage member 2 based on the hysteresis compensation and the post-compensation OCV based on the measurement results of the state of the power storage member 2 including at least the current value acquired through communication.

Figure 23:
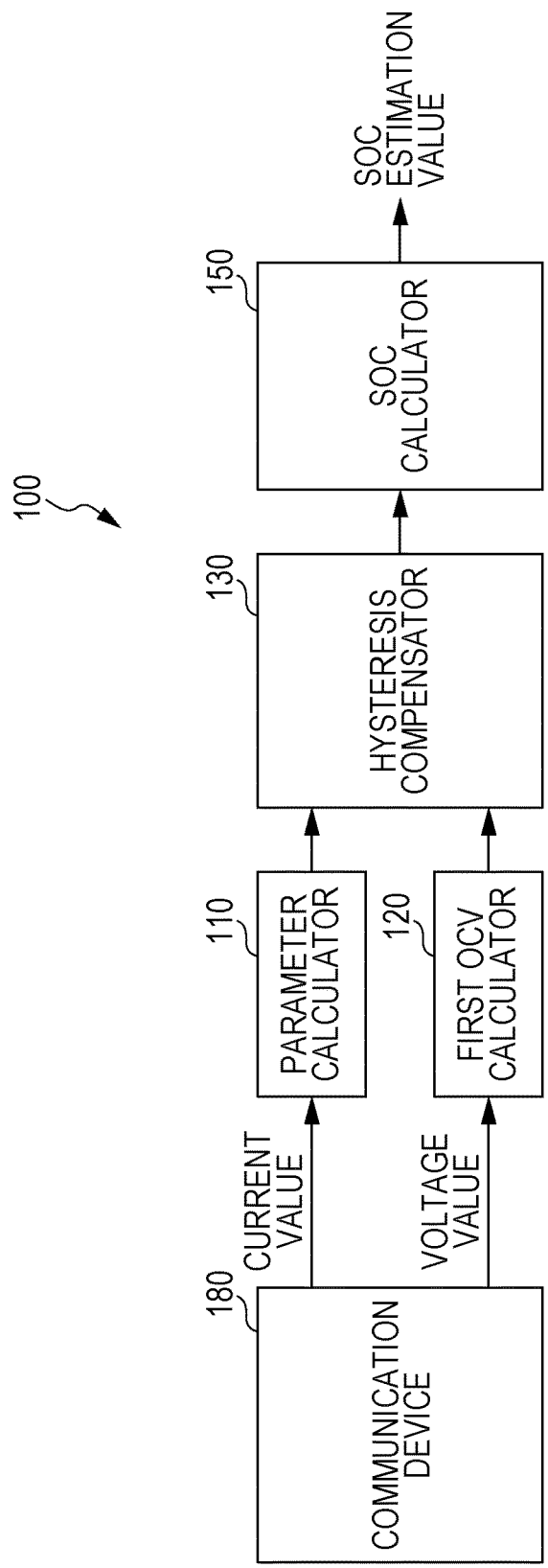
FIG. 23 is a block diagram showing a configuration example of the power storage member state estimation device of a seventh embodiment of the disclosure.

FIG. 23 shows a more specific configuration example. As shown in FIG. 23, the power storage member state estimation device 100 includes a communication device 180. The parameter calculator 110 receives current information of the power storage member 2 by communication via the communication device 180. The parameter calculator 110 calculates the parameter based on the received information. The first OCV calculator 120 receives current information of the power storage member 2 by communication via the communication device 180. The first OCV calculator 120 calculates the pre-compensation OCV based on the reception information. The parameter and pre-compensation OCV calculated in this way are used in the hysteresis compensation by the hysteresis compensator 130 and the calculation of the SOC by the SOC calculator 150.

The power storage member state estimation device 100 may be present at a position isolated from the power storage member 2. The power storage member state estimation device 100 may be communicatively connected to the configuration on the power storage member 2 side via a network. The network may be an external network or the like. The external network may be the Internet, or the like. The power storage member state estimation device 100 may be a server, or the like, on the Internet. The form of reception of information of the power storage member 2 by the power storage member state estimation device 100 is not limited, and the information of the power storage member 2 passing though any route to be received by the power storage member state estimation device 100 is within the scope of the disclosure. The specific form of the communication method of the communication device 180 is not limited. A communication device that transmits measurement information of the state of the power storage member 2 to the power storage member state estimation device 100 may be also provided on the power storage member 2 side.

Operation Example of Device

Figure 24:
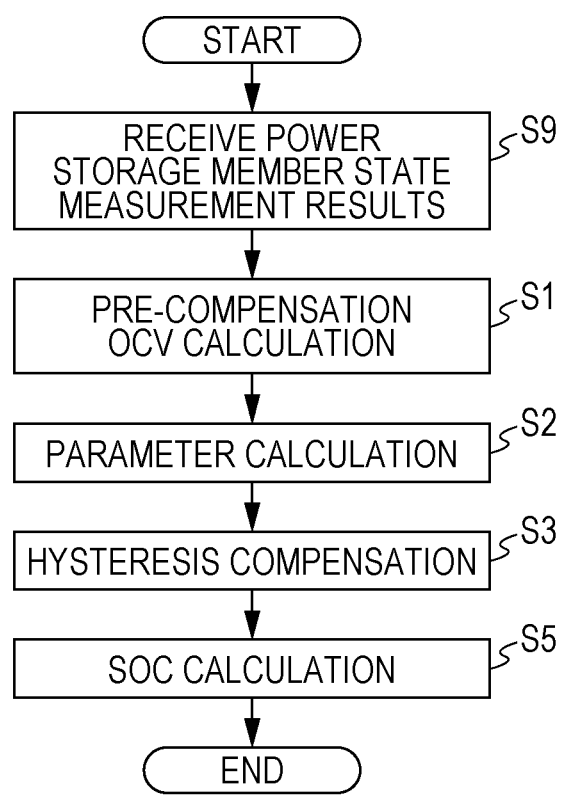
FIG. 24 is a flowchart showing an operation example of the power storage member state estimation device of the seventh embodiment of the disclosure.

FIG. 24 is a flowchart showing an operation example of a power storage member state estimation device 100 of the embodiment. The operation example shown in FIG. 24 is an embodiment of a power storage member state estimation method according to the disclosure.

In the embodiment, step 9 (S9) is executed before step 1 (S1) in FIG. 15. Specifically, in step 9 (S9), the measurement results of the state of the power storage member 2 are received by the communication device 180. The reception trigger is not limited. For example, the configuration may be one in which a request for information on the power storage member 2 is made from the power storage member state estimation device 100 side to the power storage member 2 side, and the power storage member 2 side responds to the request, or may be a configuration in which information on the power storage member 2 is constantly or periodically transmitted from the power storage member 2 side to the power storage member state estimation device 100 side.

According to the embodiment, it is possible to exhibit the same effects as the power storage member state estimation device 100 in FIG. 14, or possible to estimate the state of power storage members 2 present at a plurality of locations with a single power storage member state estimation device 100.

9. Eighth Embodiment

Figure 25:
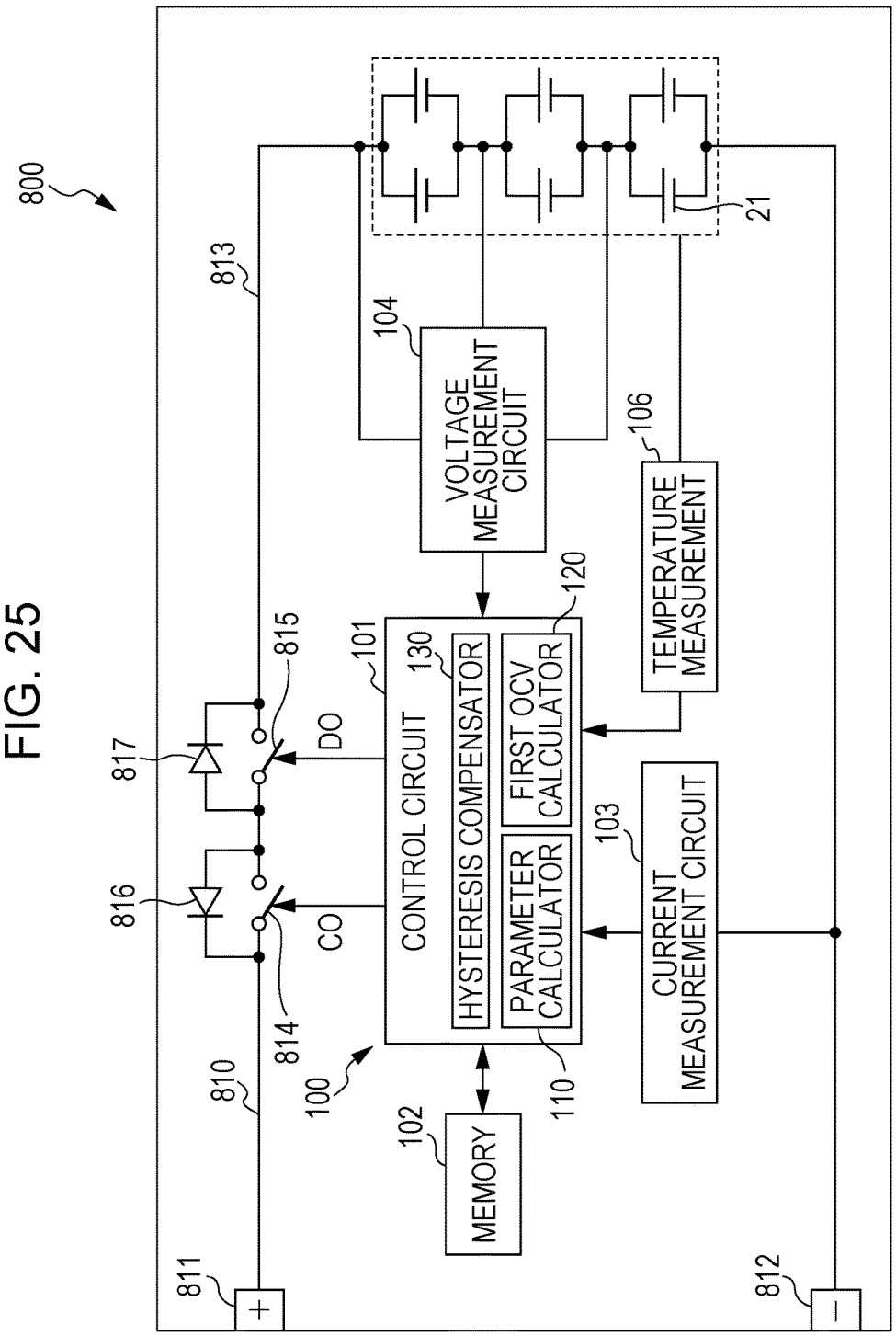
FIG. 25 is a circuit configuration diagram showing a configuration example of a battery pack of an embodiment of the disclosure.

FIG. 25 is a block diagram that shows a circuit configuration example in a case in which the power storage member state estimation device 100 in FIG. 1 is applied to a battery pack 800. The battery pack 800 includes the power storage member state estimation device 100, a secondary battery 21 that is an example of the power storage member 2, and a charge and discharge circuit 810.

The parameter calculator 110, the first OCV calculator 120, and the hysteresis compensator 130 of the power storage member state estimation device 100 are incorporated in a control circuit 101. The power storage member state estimation device 100 includes a memory 102. The memory 102 is formed from a RAM or ROM, and, for example, may be formed from an erasable programmable read only memory (EPROM), or the like, that is a non-volatile memory. A program, data or the like for causing the control circuit 101 to function as a power storage member state estimation device 100 is stored in the memory 102. In addition thereto, numerical values calculated by the control circuit 101, internal resistance values in the initial state of the power storage member 2 measured at the manufacturing process stage and the like are stored in the memory 102 in advance, and may be rewritten, as appropriate.

The power storage member state estimation device 100 includes a current measurement circuit 103, a voltage measurement circuit 104, and a temperature measurement circuit 106. The current measurement circuit 103 measures the current value of the secondary battery 21, and outputs the measurement results to the control circuit 101. The specific form of the current measurement circuit 103 is not limited, and, for example, may be configured by a current sensor, an analog front end or the like connected to the electrical path of the secondary battery 21. The voltage measurement circuit 104 measures the terminal current of the secondary battery 21, and outputs the measurement results to the control circuit 101. The specific form of the voltage measurement circuit 104 is not limited, and, for example, may be configured by a current sensor, an analog front end or the like connected to the electrical path of the secondary battery 21. The temperature measurement circuit 106 measures the temperature of the secondary battery 21, and outputs the measurement results to the control circuit 101. The specific form of the temperature measurement circuit 106 is not limited, and, for example, may be configured by a thermistor, an analog front end or the like mounted in the secondary battery 21.

The power storage member state estimation device 100 may output data of the estimated battery state of the secondary battery 21 or a calculation value based thereupon, that is another battery state to a display device, not shown. The display device may display an image indicating the battery state based on the data input from the power storage member state estimation device 100. Although the image may be an image displaying the remaining battery capacity level, there is no limitation thereto. The display device may be included in the battery pack 800, or may be included in a device connected to the battery pack 800.

A plurality of secondary batteries 21 is arranged in the configuration in FIG. 25. More specifically, a plurality of parallel connection blocks of secondary batteries 21 are connected in series in the configuration in FIG. 25. The voltage measurement circuit 104 may measure the voltage of each parallel connection block. The temperature measurement circuit 106 may measure the temperature of all of the secondary batteries 21, or may measure the temperature of one or a plurality of representative secondary batteries 21. The connection form of each secondary battery 21 is not limited to the form shown in FIG. 25.

The charge and discharge circuit 810 includes a cathode terminal 811, an anode terminal 812, a power source line 813 arranged between both terminals 811 and 812, and a charge control switch 814 and a discharge control switch 815 arranged on the power source line 813. The charge and discharge circuit 810 includes diodes 816 and 817 connected in parallel to each switch 814 and 815.

During charging, the cathode terminal 811 is connected to the cathode terminal of the charge device, and the anode terminal 812 is connected to the anode terminal of the charge device, thereby charging is performed. During discharging, the cathode terminal 811 is connected to the cathode terminal of the load, and the anode terminal 812 is connected to the anode terminal of the load, thereby discharging is performed. The specific form of the load is not limited. For example, the load may be a device main body portion that configures an electronic device along with the battery pack 800. The electronic device may be a notebook personal computer, a portable information terminal (PDA), a portable telephone, a cordless phone handset, a video movie, a digital camera, an electronic book, an electronic dictionary, a music player, a radio, headphones, a game device, a navigation system, a memory card, a pacemaker, a hearing aid, an electric tool, an electric shaver, a refrigerator, an air conditioner, a television, a stereo, a water heater, a microwave oven, a dishwasher, a clothes washing machine, a clothes dryer, lighting equipment, a toy, medical equipment, a robot, a road conditioner, a signal device or the like.

The diode 816 connected in parallel to the charge control switch 814 has a polarity in the forward direction with respect to discharge current flowing from the anode terminal 812 in the direction of the secondary battery 21 in the reverse direction with respect to the charge current flowing from the cathode terminal 811 in the direction of the secondary battery 21. Meanwhile, the diode 817 connected in parallel to the discharge control switch 815 has a polarity in the reverse direction with respect to the discharge current in the forward direction with respect to the charge current. In the configuration in FIG. 25, although the switches 814 and 815 are provided on the +side, they may be provided on the − side.

The charge control switch 814 controls the on state or off state based on a charge control signal CO from the control circuit 101. In the off state of the charge control switch 814, only discharging is possible by interposing the diode 816.

The discharge control switch 815 controls the on state or off state based on a discharge control signal DO from the control circuit 101. In the off state of the discharge control switch 815, only charging is possible by interposing the diode 817.

The charge control switch 814 may be set to off in cases in which the voltage reaches an overcharge detection voltage. The charge control switch 814 may be set to off in cases in which a large current flows during charging. The discharge control switch 815 may be set to off in cases in which the voltage reaches an overdischarge detection voltage. The discharge control switch 815 may be set to off in cases in which a large current flows during discharging.

A semi-conductor switch such as a MOSFET, for example, may be used as the charge control switch 814 and the discharge control switch 815. In this case, the diodes 816 and 817 may be MOSFET parasitic diodes. In a case in which P-channel FETs are used as the switches 816 and 817, the control circuit 101 may supply the control signals CO and DO with respect to the gates of the switches 814 and 815. The switches 814 and 815 may be set to on by a gate potential lower than the source potential and a predetermined value or greater. That is, in the normal charge and discharge operations, the control signals CO and Do may be at a low level. For example, when overcharging or over-discharging, the control signals CO and DO may be set to a high level, and the switches 814 and 815 may be set to the off state.

The control circuit 101 may perform charge and discharge control during abnormal heat generation based on the detected temperature of the secondary battery 21.

According to the embodiment, by including the power storage member state estimation device 100, it is possible to realize a battery pack able to estimate the OCV with high precision.

10. Ninth Embodiment

Figure 26:
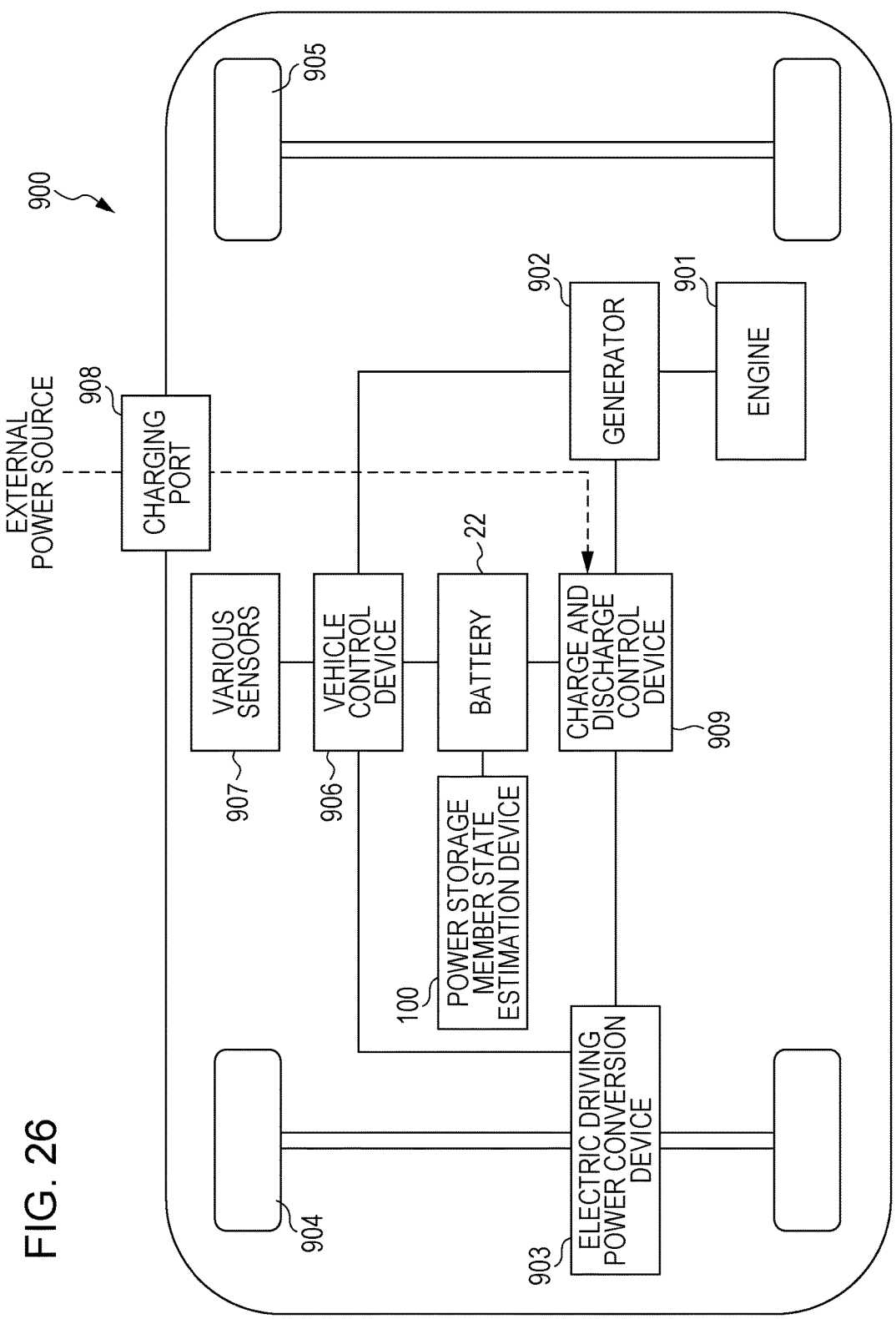
FIG. 26 is a block diagram showing a configuration example of an electric vehicle of the embodiment of the disclosure.

FIG. 26 schematically shows an example of the configuration of a hybrid vehicle 900 to which the power storage member state estimation device 100 of the disclosure. The hybrid vehicle 900 is an embodiment of the electric vehicle of the disclosure. The hybrid vehicle 900 employs a series hybrid system. A series hybrid system is a vehicle driven by a driving power conversion device using the power generated by a power generator operated by the engine. The hybrid vehicle 900 includes an engine 901, a generator 902, a driving power conversion device 903, a drive wheel 904, wheel 905, a battery 22, a vehicle control device 906, various sensors 907, a charging port 908, a charge and discharge control device 909 and the power storage member state estimation device 100. The battery 22 is one form of the power storage member 2.

The hybrid vehicle 900 is driven with the driving power conversion device 903 as a driving source. The driving power conversion device 903 may be, for example, a motor. The charge and discharge control device 909 operates the driving power conversion device 903 by discharging power stored in the battery 22 by connecting the battery 22 and the driving power conversion device 903 to the driving power conversion device 903. The torque of the driving power conversion device 903 is transferred to the drive wheel 904. Either of an alternating current motor and a direct current motor may be applied as the driving power conversion device 903. The various sensors 907 control the number of engine revolutions via a vehicle control device 906; and control the opening degree, that is, the throttle opening degree, of a throttle valve, not shown. The various sensors 907 may include a velocity sensor, an acceleration sensor, a number of engine revolutions sensor or the like.

In the hybrid vehicle 900, the torque of the engine 901 is transferred to the generator 902, and power is generated by the torque. The charge and discharge control device 909 is connected to the generator 902 and the battery 22, and stores power generated by the generator 902 in the battery 22. When the hybrid vehicle 900 decelerates due to a braking mechanism, not shown, the resistance force during the deceleration is applied to the driving power conversion device 903 as torque, and the regeneration power generated with the driving power conversion device 903 by the torque is accumulated in the battery 22. The battery 22 is further able to store power supply from the power source to the charging port 908 as an input port by being connected to an external power source of the hybrid vehicle 900 via the charge and discharge control device 909.

The power storage member state estimation device 100 may output the state of the battery 22, or a calculated value based thereupon, that is, data of another state of the battery 22 to a display device for display, not shown, in the vehicle. Although the display device in the vehicle may be in-vehicle equipment, an installed panel display device or the like, there is no limitation thereto.

The electric vehicle of the disclosure may be effectively applied with respect to a parallel hybrid vehicle with either of the output of an engine and a motor as the driving source, and using and appropriately switching between three methods of driving with the engine only, driving with the motor only and driving with both the engine and the motor. Furthermore, the electric vehicle of the disclosure may be validly applied with respect to a vehicle that runs with driving by a driving motor only without using an engine.

According to the embodiment, by including the power storage member state estimation device 100, it is possible to realize an electric vehicle able to estimate the OCV with high precision.

11. Tenth Embodiment

Figure 27:
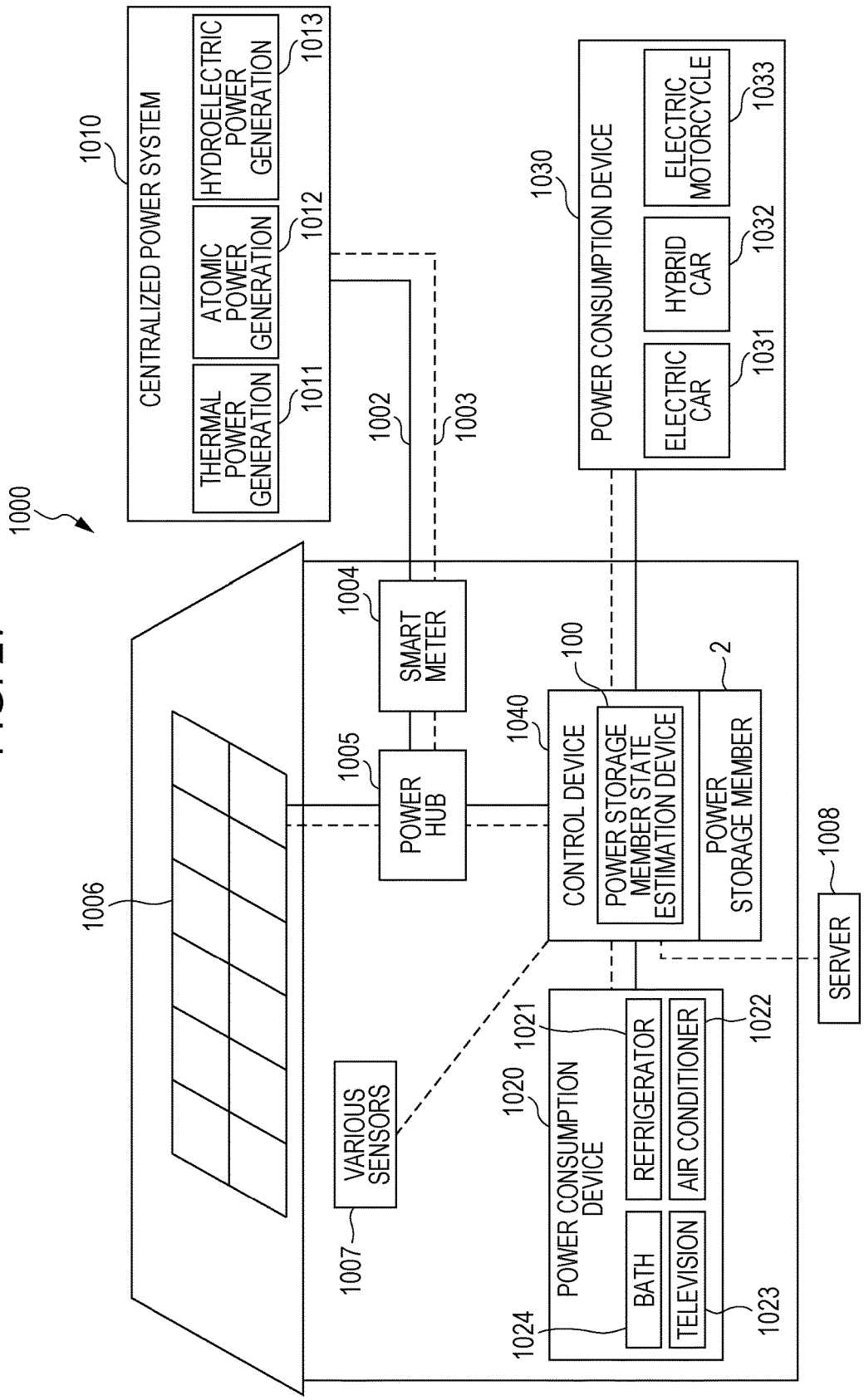
FIG. 27 is a block diagram showing a configuration example of a power storage device of the embodiment of the disclosure.

FIG. 27 shows a configuration example of the power storage device 1000 to which the power storage member state estimation device 100 of the disclosure is applied. The power storage device 1000 is applied to, for example, structures such as a residential home or a building.

As shown in FIG. 27, in the power storage device 1000, power is supplied to the power storage member 2 from a centralized power generation system 1010, such as thermal power 1011, atomic power 1012, and hydroelectric power 1013 via a power network 1002, an information network 1003, a smart meter 1004, a power hub 1005 or the like. In so doing, the power storage member 2 is charged. The power is supplied to power storage member 2 from an independent power source of a domestic power generation device 1006. The power stored in the power storage member 2 is supplied to power consumption devices 1020 in the house, such as, for example, a refrigerator 1021, an air conditioner 1022, a television 1023, or a bath 1024. The power of the power storage member 2 is supplied to power consumption devices 1030 outside the house, such as, for example, an electric car 1031, a hybrid car 1032 or an electric motorcycle 1033.

The power network 1002 may be configured to perform power supply by one or a plurality of any of a direct current power supply, an alternating current power supply and a contactless power supply. The information network 1003 may use any communication method of Zigbee (registered trademark), Power Line Communications (PLC), WiFi (registered trademark) and Bluetooth (registered trademark). The smart meter 1004 is provided with a function measuring the usage amount of commercial power, and transmitting the measured usage amount to a power company. The power generation device 1006 may be a solar cell, a fuel cell or the like.

As shown in FIG. 27, the power storage device 1000 includes a control device 1040, and the control device 1040 includes the power storage member state estimation device 100 of the disclosure.

As shown in FIG. 27, the power storage device 1000 includes various sensors 1007. The various sensors 1007 may be, for example, presence sensors, illumination sensors, object detection sensors, power consumption sensors, sway sensors, contact sensors, temperature sensors, infrared sensors and the like. The information acquired by the various sensors 1007 is transmitted to the control device 1040.

As shown in FIG. 27, the power storage device 1000 includes a server 1008. The server 1008 is connected to the control device 1040. The server 1008 may be managed by any of the residential house, a power company, or a service provider. The information transmitted by the server 1008, for example, is power consumption information, daily life pattern information, power charges, weather information, natural disaster information, and information relating to power transactions. Although this information may be transmitted and received from a power consumption device 1020 inside the house (for example, a television), the information may also be transmitted and received from a device outside the house (for example, a mobile telephone, or the like). This information may be suitably displayed on a device with a display function, for example, a television, a portable telephone, a PDA or the like. The power storage member state estimation device 100 may output the state of the power storage member 2 or a calculated value based thereupon, that is, data of another state of the power storage member 2, on a display device for displaying the state.

The control device 1040, in addition to the functions of the power storage member state estimation device 100, includes, for example, functions of adjusting the usage amount of commercial power and the power generation amount. In addition thereto, the control device 1040 may include functions such as performing power transactions on the power market.

According to the embodiment, by including the power storage member state estimation device 100, it is possible to realize a power storage device able to estimate the OCV with high precision.

Each of the above-described embodiments and modification examples may be combined, as appropriate. Cases in which the constituent portions in any arbitrary embodiment or modification example are added to another embodiment or modification example, or are substituted with the constituent portions in another embodiment or modification example fall within the scope of the disclosure.

For example, the third embodiment may be combined with any of the fourth to seventh embodiments. In this case, it is desirable that the SOC calculator 150 perform the SOC calculation based on the post-compensation OCV being output by the hysteresis compensator 130 or the OCV validity flag being negative or the like, in cases in which the determination results by the OCV validity determination device 140 are negative. By doing so, it is possible to avoid estimation errors of the SOC in advance.

The actions and effects described in each embodiment and modification example are merely examples, and the disclosure is not limited thereto, and there may be additional actions and effects. The disclosure may exhibit any one of the plurality of actions and effects disclosed in each of the embodiments and modification examples.

The present disclosure may take the following configuration.

(1) A power storage member state estimation device includes a parameter calculator that calculates a parameter based on an obtained current value of a power storage member; a first open circuit voltage calculator that calculates an open circuit voltage of the power storage member; a hysteresis compensator that performs hysteresis compensation that reduces errors due to hysteresis of the open circuit voltage calculated by the first open circuit voltage calculator based on the parameter calculated by the parameter calculator.

(2) The power storage member state estimation device according (1) in which the parameter includes at least one of a direction having a high frequency of current flowing in a direction of current of the power storage member, an average current value of the power storage member, and a charge and discharge capacity after the direction having a high frequency of current flowing is switched.

(3) The power storage member state estimation device according to (1) or (2) in which the hysteresis compensator includes a hysteresis compensation amount calculator that calculates a compensation amount of the open circuit voltage corresponding to the parameter, and a second open circuit voltage calculator that calculates the open circuit voltage after the hysteresis compensation based on the compensation amount calculated by the hysteresis compensation amount calculator.
(4) The power storage member state estimation device according to (3) in which the hysteresis compensation amount calculator calculates the compensation amount further corresponding to at least one of a current value, a temperature, and a charging state estimation value of the power storage member.
(5) The power storage member state estimation device according to any of (1) to (4), further including an open circuit voltage validity determination device that determines whether the open circuit voltage calculated by the first open circuit voltage calculator is valid as a target of the hysteresis compensation based on at least one of the parameter, the current value, the temperature and the charging state estimation value of the power storage member, in which the hysteresis compensator performs the hysteresis compensation with respect to open circuit voltage determined to be valid by the open circuit voltage validity determination device.
(6) The power storage member state estimation device according to any of (1) to (5), further including a charging state calculator that calculates a charging state value of the power storage member based on the open circuit voltage after the hysteresis compensation.
(7) The power storage member state estimation device according to (6), further including an open circuit voltage curve calculator that calculates an open circuit voltage curve of the power storage member based on the charging state value calculated by the charging state calculator.
(8) The power storage member state estimation device according to (7) in which the parameter includes the direction having a high frequency of current flowing in the direction of current of the power storage member, and the open circuit voltage curve calculator includes a storage device that stores the open circuit voltage after hysteresis compensation, the direction having a high frequency of current flowing calculated by the parameter calculator, and the charging state value calculated by the charging state calculator, and an open circuit voltage generator that generates two open circuit voltage curves according to a difference in the direction having a high frequency of current flowing based on information recorded in the storage device.
(9) The power storage member state estimation device according to (7) or (8), further including a deterioration state calculator that calculates a deterioration state value of the power storage member based on the open circuit voltage curve calculated by the open circuit voltage curve calculator.
(10) The power storage member state estimation device according to any of (1) to (9) in which calculation of a state value of the power storage member is performed based on the hysteresis compensation based on the measurement results of the state of the power storage member that includes at least a current value acquired by communication and the open circuit voltage after hysteresis compensation.
(11) A power storage member state estimation program causing a computer to execute the functions of a unit for calculating a parameter based on an acquired current value of a power storage member, a unit for calculating an open circuit voltage of the power storage member, and a unit for performing hysteresis compensation that reduces errors due to hysteresis of the open circuit voltage calculated based on the calculated parameter.

Furthermore, the present disclosure may take the following configuration.
(1') A power storage module state estimation apparatus comprising a parameter calculator configured to calculate a parameter based on a current value of a power storage module, wherein the parameter includes at least one of a direction having a high frequency of current flowing in the power storage module, an average current value of the power storage module, and a charge and discharge capacity after the direction having the high frequency of current flowing in the power storage module is switched; and a hysteresis compensator configured to use the parameter to compensate an open circuit voltage of the power storage module.
(2') The power storage module state estimation apparatus according to (1'), wherein using a compensated open circuit voltage of the power storage module improves accuracy of an estimation of a state of charge of the power storage module.
(3') The power storage module state estimation apparatus according to (1') or (2'), further comprising an open circuit voltage calculator configured to calculate the open circuit voltage of the power storage module.
(4') The power storage module state estimation apparatus according to (3'), further comprising an open circuit voltage validity determination module configured to determine whether the open circuit voltage calculated by the open circuit voltage calculator is valid.
(5') The power storage module state estimation apparatus according to any of (1') to (4'), further comprising a charging state calculator configured to calculate a charging state value of the power storage module using a compensated open circuit voltage of the power storage module.
(6') The power storage module state estimation apparatus according to (5'), further comprising an open circuit voltage curve calculator configured to calculate an open circuit voltage curve of the power storage member based on the charging state value calculated by the charging state calculator.
(7') The power storage module state estimation apparatus according to (6'), further comprising a deterioration state calculator configured to calculate a deterioration state value of the power storage member based on the open circuit voltage curve calculated by the open circuit voltage curve calculator.
(8') The power storage module state estimation apparatus according to any of (1') to (7'), further comprising a temperature reader configured to provide a temperature of the power storage module to the hysteresis compensator for compensating the open circuit voltage of the power storage module.
(9') The power storage module state estimation apparatus according to any of (1') to (8'), wherein at least one of a hybrid vehicle and an electric vehicle includes the power storage module.
(10') The power storage module state estimation apparatus according to any of (1') to (8'), wherein a building includes the power storage module.
(11') The power storage module state estimation apparatus according to any of (1') to (10'), wherein the power storage module is a secondary battery.

(12') The power storage module state estimation apparatus according to any of (1') to (11'), wherein the power storage module is a hybrid capacitor.

(13') A battery pack comprising a power storage module; a parameter calculator configured to calculate a parameter based on a current value of the power storage module, wherein the parameter includes at least one of a direction having a high frequency of current flowing in the power storage module, an average current value of the power storage module, and a charge and discharge capacity after the direction of a dominant current flow is switched; and a hysteresis compensator configured to use the parameter to compensate an open circuit voltage of the power storage module.

(14') The battery pack according to claim (13'), wherein the power storage module is a lithium ion secondary battery using an olivine-type iron phosphate as the cathode material.

(15') The battery pack according to (13') or (14'), further comprising a temperature measurement circuit.

(16') The battery pack according to (13') to (15'), wherein the battery pack is configured to be connected to an electronic device.

(17') A method for estimating the state of a power storage module comprising calculating a parameter based on a current value of a power storage module, wherein the parameter includes at least one of a direction having a high frequency of current flowing in the power storage module, an average current value of the power storage module, and a charge and discharge capacity after the direction having the high frequency of current flowing in the power storage module is switched; and compensating an open circuit voltage of the power storage module based the parameter.

(18') The method according to (17'), wherein using a compensated open circuit voltage of the power storage module improves accuracy of an estimation of a state of charge of the power storage module.

(19') The method according to (17') or (18'), further comprising calculating the open circuit voltage of the power storage module.

(20') The method according to (19'), further comprising determining whether the calculated open circuit voltage is valid.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A power storage module state estimation apparatus comprising:
   a parameter calculator configured to calculate a parameter based on a current value of a power storage module, wherein the parameter is selected from the group consisting of a direction of a current having a high frequency of current and flowing in the power storage module, an average current value of the power storage module, and a charge and discharge capacity after the direction of the current having the high frequency of current and flowing in the power storage module is switched;
   a hysteresis compensator configured to use the parameter to compensate an open circuit voltage of the power storage module;
   an open circuit voltage calculator configured to calculate the open circuit voltage of the power storage module; and
   an open circuit voltage validity determination module configured to determine whether the open circuit voltage calculated by the open circuit voltage calculator is valid.

2. The power storage module state estimation apparatus according to claim 1, wherein using a compensated open circuit voltage of the power storage module improves accuracy of an estimation of a state of charge of the power storage module.

3. The power storage module state estimation apparatus according to claim 1, further comprising a charging state calculator configured to calculate a charging state value of the power storage module using a compensated open circuit voltage of the power storage module.

4. The power storage module state estimation apparatus according to claim 3, further comprising an open circuit voltage curve calculator configured to calculate an open circuit voltage curve of the power storage member based on the charging state value calculated by the charging state calculator.

5. The power storage module state estimation apparatus according to claim 4, further comprising a deterioration state calculator configured to calculate a deterioration state value of the power storage member based on the open circuit voltage curve calculated by the open circuit voltage curve calculator.

6. The power storage module state estimation apparatus according to claim 1, further comprising a temperature reader configured to provide a temperature of the power storage module to the hysteresis compensator for compensating the open circuit voltage of the power storage module.

7. The power storage module state estimation apparatus according to claim 1, wherein at least one of a hybrid vehicle and an electric vehicle includes the power storage module.

8. The power storage module state estimation apparatus according to claim 1, wherein a building includes the power storage module.

9. The power storage module state estimation apparatus according to claim 1, wherein the power storage module is a secondary battery.

10. The power storage module state estimation apparatus according to claim 1, wherein the power storage module is a hybrid capacitor.

11. A battery pack comprising:
    a power storage module;
    a parameter calculator configured to calculate a parameter based on a current value of the power storage module, wherein the parameter is selected from the group consisting of a direction of a current having a high frequency of current and flowing in the power storage module, an average current value of the power storage module, and a charge and discharge capacity after a direction of a dominant current flow is switched;
    a hysteresis compensator configured to use the parameter to compensate an open circuit voltage of the power storage module;
    an open circuit voltage calculator configured to calculate the open circuit voltage of the power storage module; and an open circuit voltage validity determination module configured to determine whether the open circuit voltage calculated by the open circuit voltage calculator is valid.

12. The battery pack according to claim 11, wherein the power storage module is a lithium ion secondary battery using an olivine-type iron phosphate as the cathode material.

13. The battery pack according to claim 11, further comprising a temperature measurement circuit.

14. The battery pack according to claim 11, wherein the battery pack is configured to be connected to an electronic device.

15. A method for estimating the state of a power storage module comprising:
 Calculating, by a parameter calculator, a parameter based on a current value of a power storage module, wherein the parameter is selected from the group consisting of a direction of a current having a high frequency of current and flowing in the power storage module, an average current value of the power storage module, and a charge and discharge capacity after the direction of the current having the high frequency of current and flowing in the power storage module is switched; and
 Compensating, by a hysteresis compensator, an open circuit voltage of the power storage module based on the parameter;
 Calculating, by an open circuit voltage calculator, the open circuit voltage of the power storage module; and
 determining, by an open circuit validity determination module, whether the calculated open circuit voltage is valid.

16. The method according to claim 15, wherein using a compensated open circuit voltage of the power storage module improves accuracy of an estimation of a state of charge of the power storage module.

17. A power storage module state estimation apparatus comprising:
 a parameter calculator configured to calculate a parameter based on a current value of a power storage module, wherein the parameter is selected from the group consisting of a direction of a current having a high frequency of current and flowing in the power storage module, an average current value of the power storage module, and a charge and discharge capacity after the direction of the current having the high frequency of current and flowing in the power storage module is switched;
 a hysteresis compensator configured to use the parameter to compensate an open circuit voltage of the power storage module;
 a charging state calculator configured to calculate a charging state value of the power storage module using a compensated open circuit voltage of the power storage module;
 an open circuit voltage curve calculator configured to calculate an open circuit voltage curve of the power storage module based on the charging state value calculated by the charging state calculator; and
 a deterioration state calculator configured to calculate a deterioration state value of the power storage module based on the open circuit voltage curve calculated by the open circuit voltage curve calculator.

18. A battery pack comprising:
 a power storage module;
 a parameter calculator configured to calculate a parameter based on a current value of the power storage module, wherein the parameter is selected from the group consisting of a direction of a current having a high frequency of current and flowing in the power storage module, an average current value of the power storage module, and a charge and discharge capacity after a direction of a dominant current flow is switched;
 a hysteresis compensator configured to use the parameter to compensate an open circuit voltage of the power storage module;
 a charging state calculator configured to calculate a charging state value of the power storage module using a compensated open circuit voltage of the power storage module;
 an open circuit voltage curve calculator configured to calculate an open circuit voltage curve of the power storage module based on the charging state value calculated by the charging state calculator;
 and a deterioration state calculator configured to calculate a deterioration state value of the power storage module based on the open circuit voltage curve calculated by the open circuit voltage curve calculator.

\* \* \* \* \*